United States Patent
Furuichi et al.

(10) Patent No.: US 10,631,307 B2
(45) Date of Patent: Apr. 21, 2020

(54) COMMUNICATION CONTROL APPARATUS, RADIO COMMUNICATION APPARATUS, COMMUNICATION CONTROL METHOD, RADIO COMMUNICATION METHOD, AND PROGRAM

(71) Applicant: SONY CORPORATION, Tokyo (JP)

(72) Inventors: Sho Furuichi, Tokyo (JP); Ryota Kimura, Tokyo (JP); Hiromasa Uchiyama, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/519,587

(22) PCT Filed: Nov. 5, 2015

(86) PCT No.: PCT/JP2015/005551
§ 371 (c)(1),
(2) Date: Apr. 17, 2017

(87) PCT Pub. No.: WO2016/092740
PCT Pub. Date: Jun. 16, 2016

(65) Prior Publication Data
US 2017/0257873 A1  Sep. 7, 2017

(30) Foreign Application Priority Data
Dec. 11, 2014  (JP) ................. 2014-250717

(51) Int. Cl.
*H04L 1/00* (2006.01)
*H04W 72/08* (2009.01)
(Continued)

(52) U.S. Cl.
CPC ......... *H04W 72/085* (2013.01); *H03M 13/27* (2013.01); *H04L 1/0048* (2013.01);
(Continued)

(58) Field of Classification Search
CPC ... H04L 1/0048; H04L 1/0071; H04L 5/0044; H04L 5/0058; H04W 72/085; H04W 24/02; H04W 72/0446
See application file for complete search history.

(56) References Cited

U.S. PATENT DOCUMENTS

2014/0119352 A1*  5/2014  Matsumoto ........... H04L 1/0043
                                                                370/337
2016/0029351 A1*  1/2016  Shimezawa ........... H04L 5/0053
                                                                370/329

FOREIGN PATENT DOCUMENTS

EP        1 775 840 A1     4/2007
JP        2004-194288 A    7/2004
(Continued)

OTHER PUBLICATIONS

International Search Report dated Jan. 29, 2016 in PCT/JP2015/005551 filed Nov. 5, 2015.
(Continued)

*Primary Examiner* — Gbemileke J Onamuti
(74) *Attorney, Agent, or Firm* — Xsensus LLP

(57) ABSTRACT

Provided is a communication control apparatus including a communication unit configured to perform communication with a radio communication apparatus of a communication system in which interleave division multiple access (IDMA) is used, and an interval control unit configured to dynamically change an interval of allocation of an interleaver used for IDMA by the radio communication apparatus.

20 Claims, 18 Drawing Sheets

(51) Int. Cl.
  *H04W 24/02*    (2009.01)
  *H04W 72/04*    (2009.01)
  *H03M 13/27*    (2006.01)
  *H04L 5/00*     (2006.01)
(52) U.S. Cl.
  CPC .......... *H04L 1/0071* (2013.01); *H04L 5/0044* (2013.01); *H04L 5/0058* (2013.01); *H04W 24/02* (2013.01); *H04W 72/0446* (2013.01)

(56) References Cited

FOREIGN PATENT DOCUMENTS

| | | |
|---|---|---|
| JP | 2007-135201 A | 5/2007 |
| JP | 2008-535392 A | 8/2008 |

OTHER PUBLICATIONS

Huang, Qian et al., "A QoS Architecture for IDMA-based Multi-service Wireless Networks," Proceedings of the 2007 IEEE International Conference on Communications (ICC 2007), Jun. 2007, XP031126470, pp. 5070-5075.
"3$^{rd}$ Generation Partnership Project; Technical Specification Group Radio Access Network; Evolved Universal Terrestrial Radio Access (E-UTRA); Medium Access Control (MAC) protocol specification," 3GPP TS 36.321 V12.3.0, Sep. 2014, pp. 1-57.
"3$^{rd}$ Generation Partnership Project; Technical Specification Group Radio Access Network; Evolved Universal Terrestrial Radio Access (E-UTRA); Radio Resource Control (RRC); Protocol specification," 3GPP TS 36.331 V12.3.0, Sep. 2014, pp. 1-378.
Office Action dated Dec. 26, 2017 in Japanese Patent Application No. 2014-250717.

\* cited by examiner

[Fig. 1]
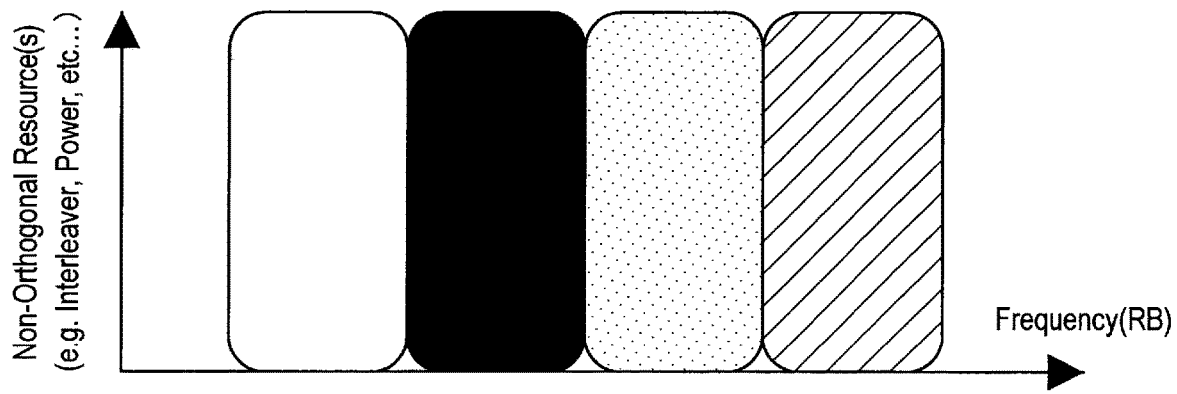
[Fig. 2]
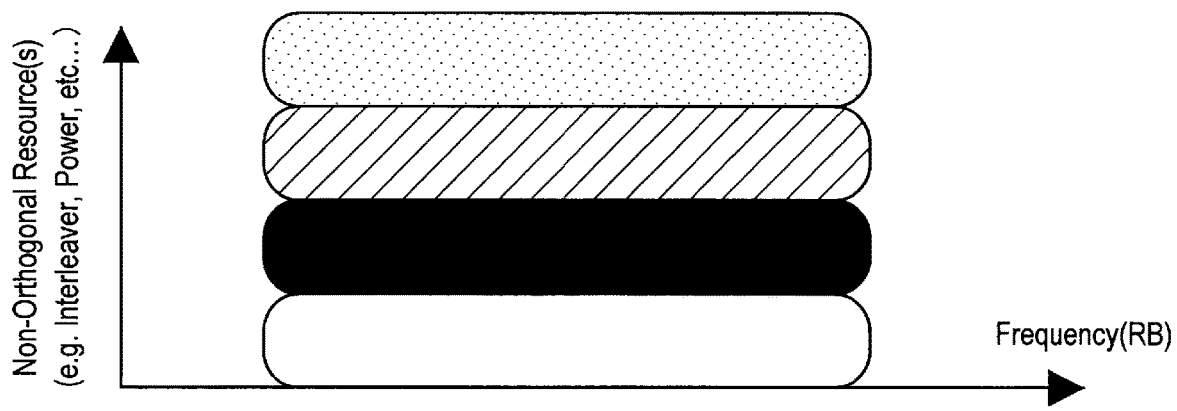

[Fig. 3]
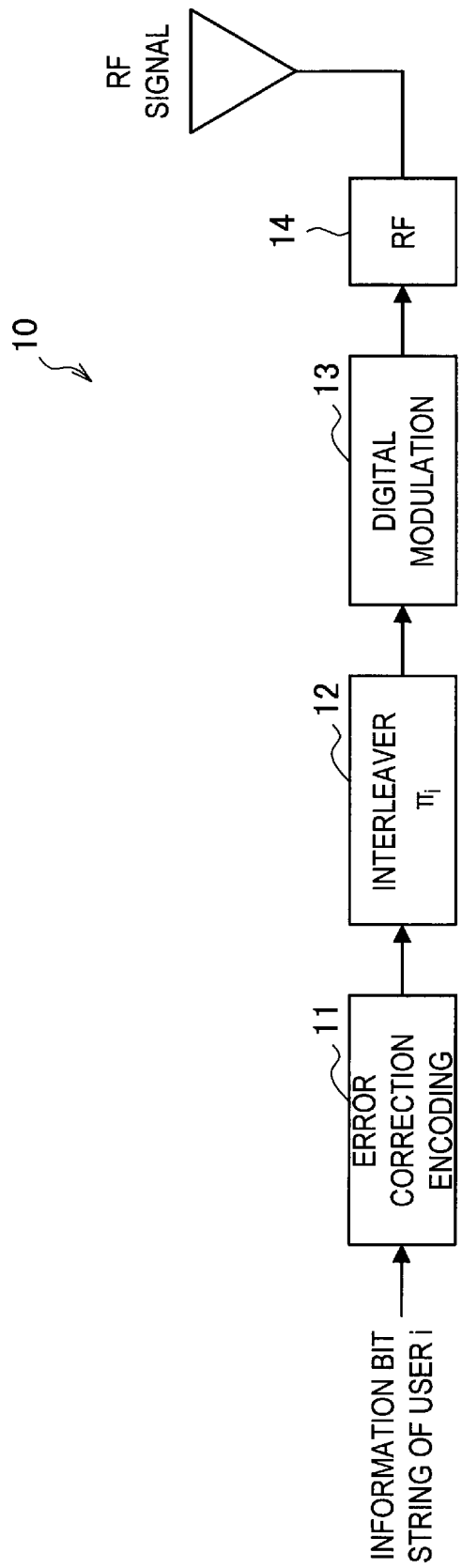

[Fig. 4]
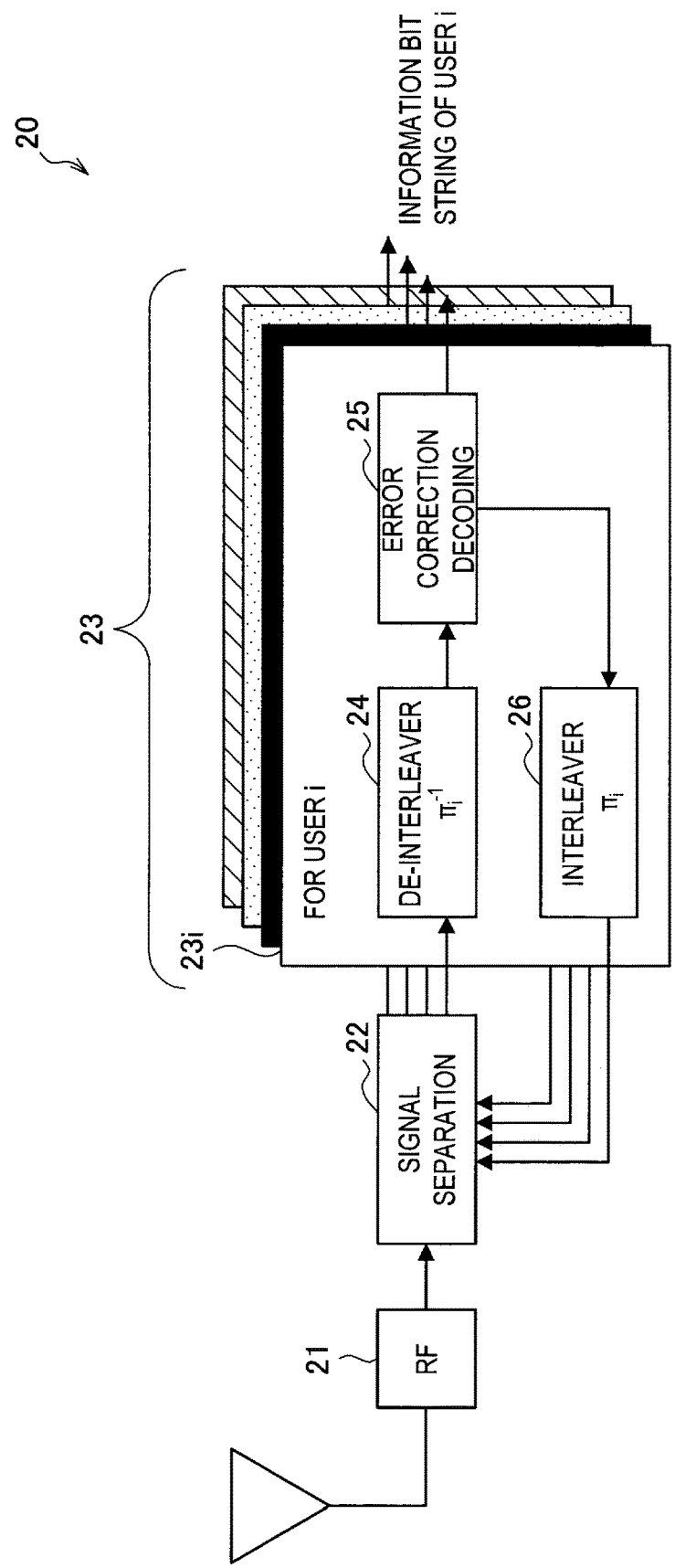

[Fig. 5]
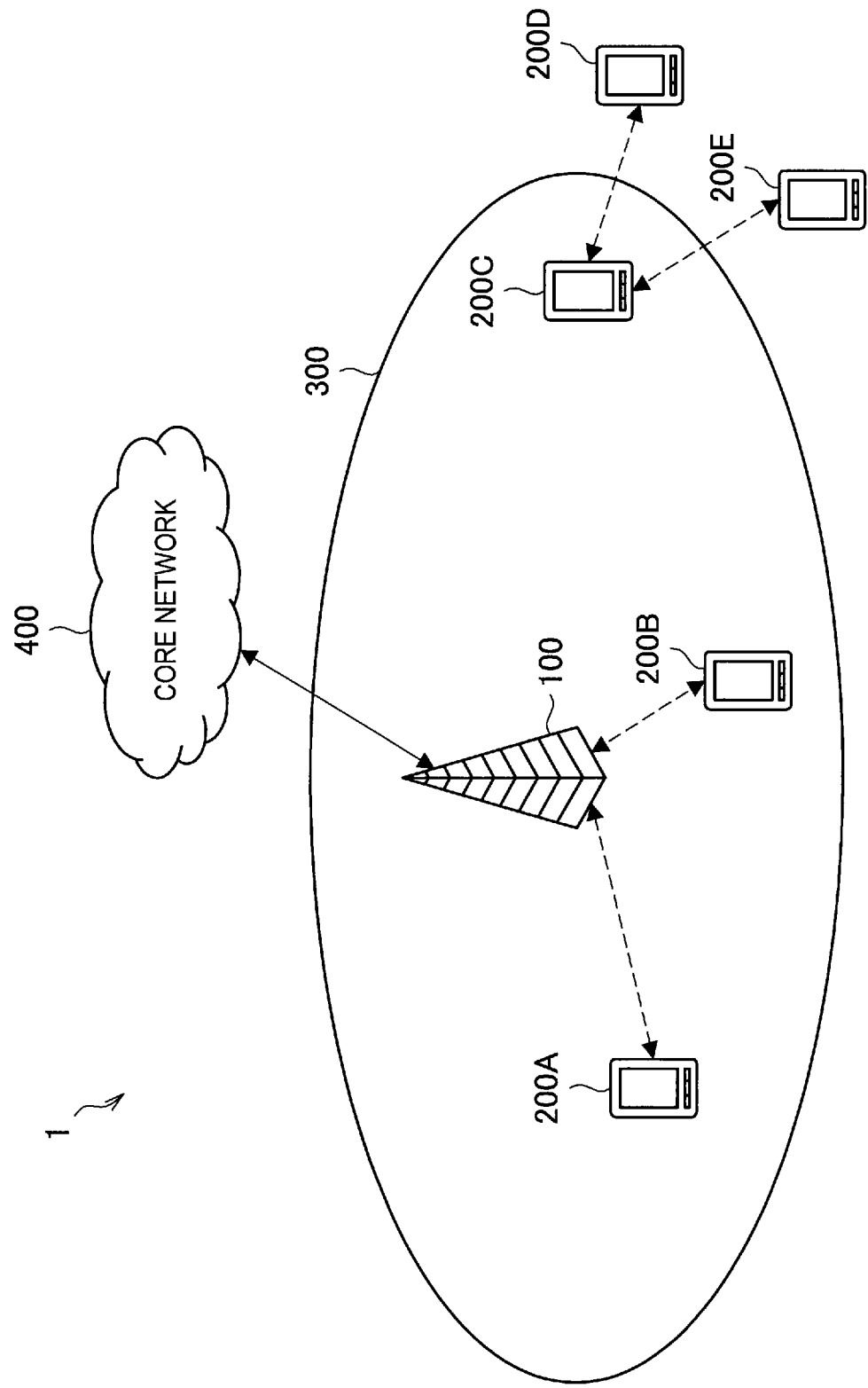

[Fig. 6]
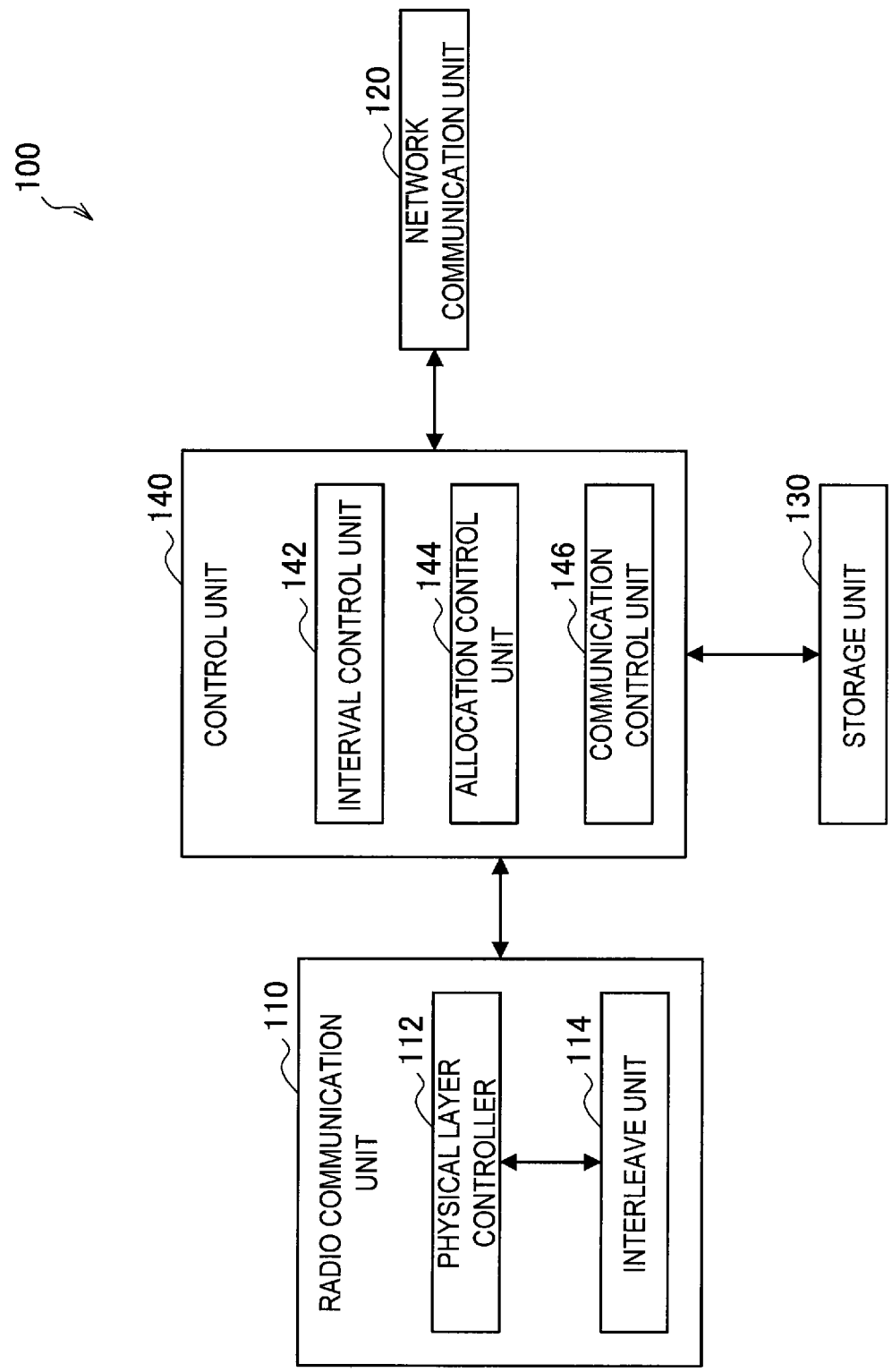

[Fig. 7]
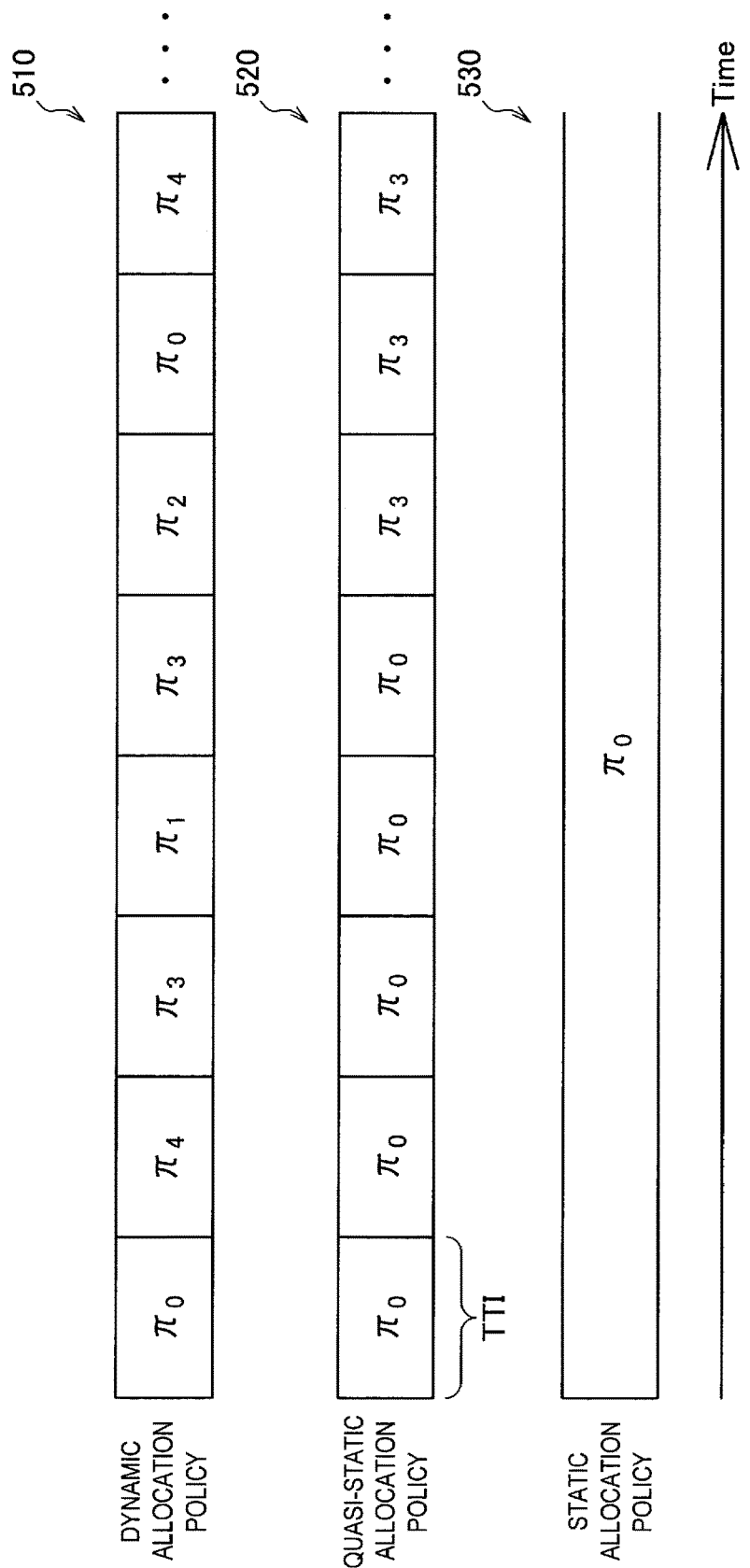

[Fig. 8]
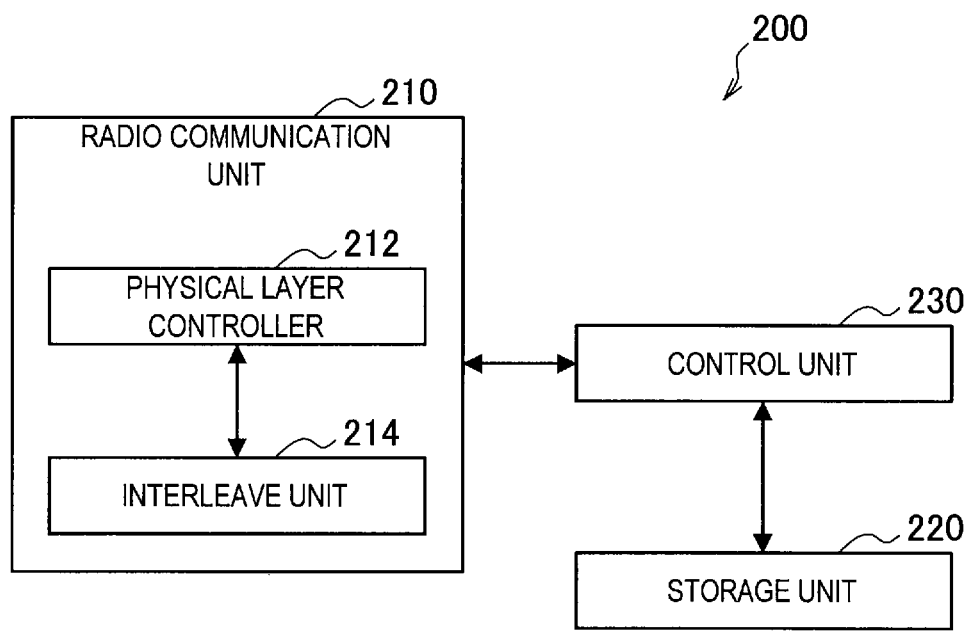

[Fig. 9]
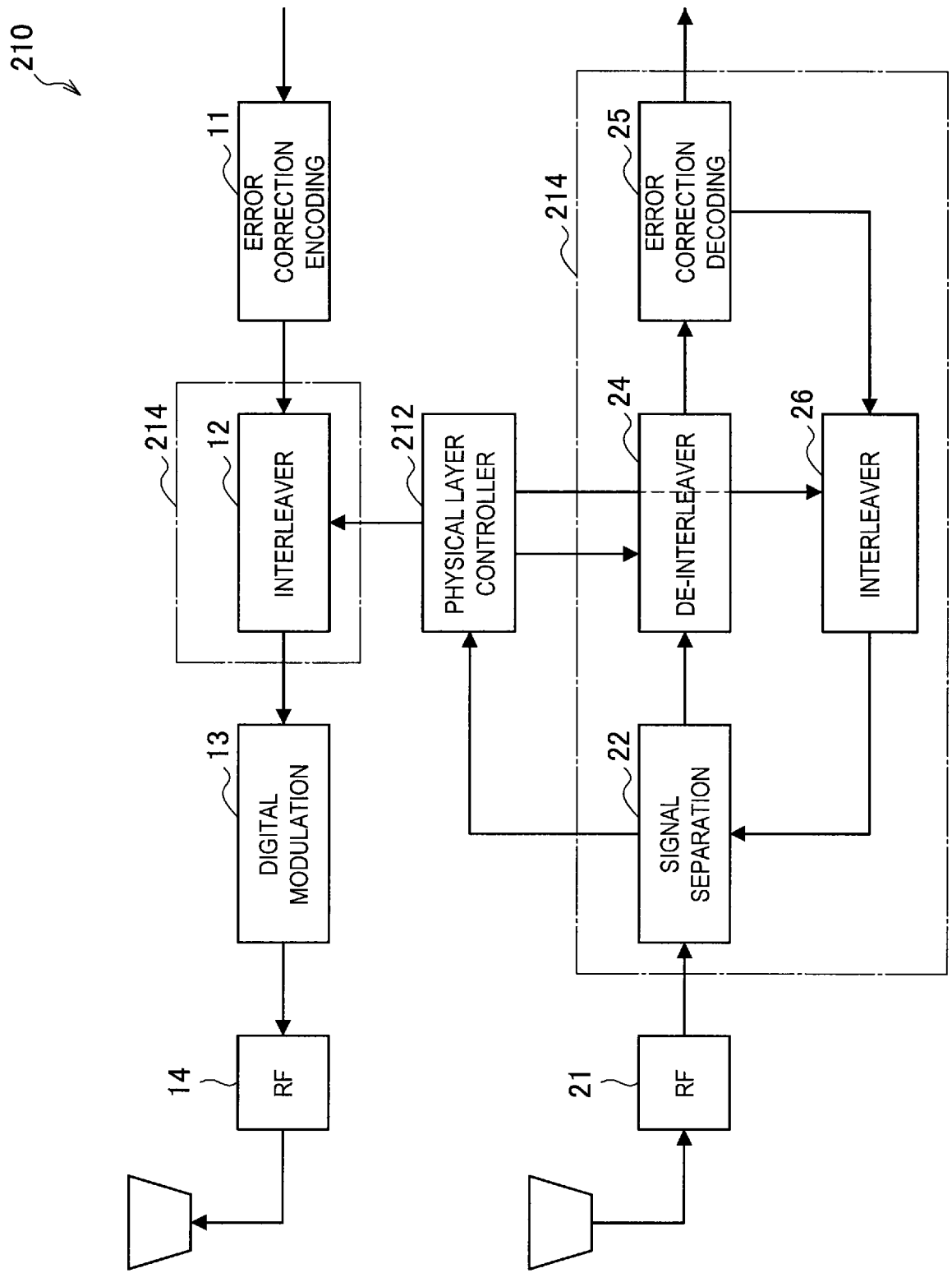

[Fig. 10]
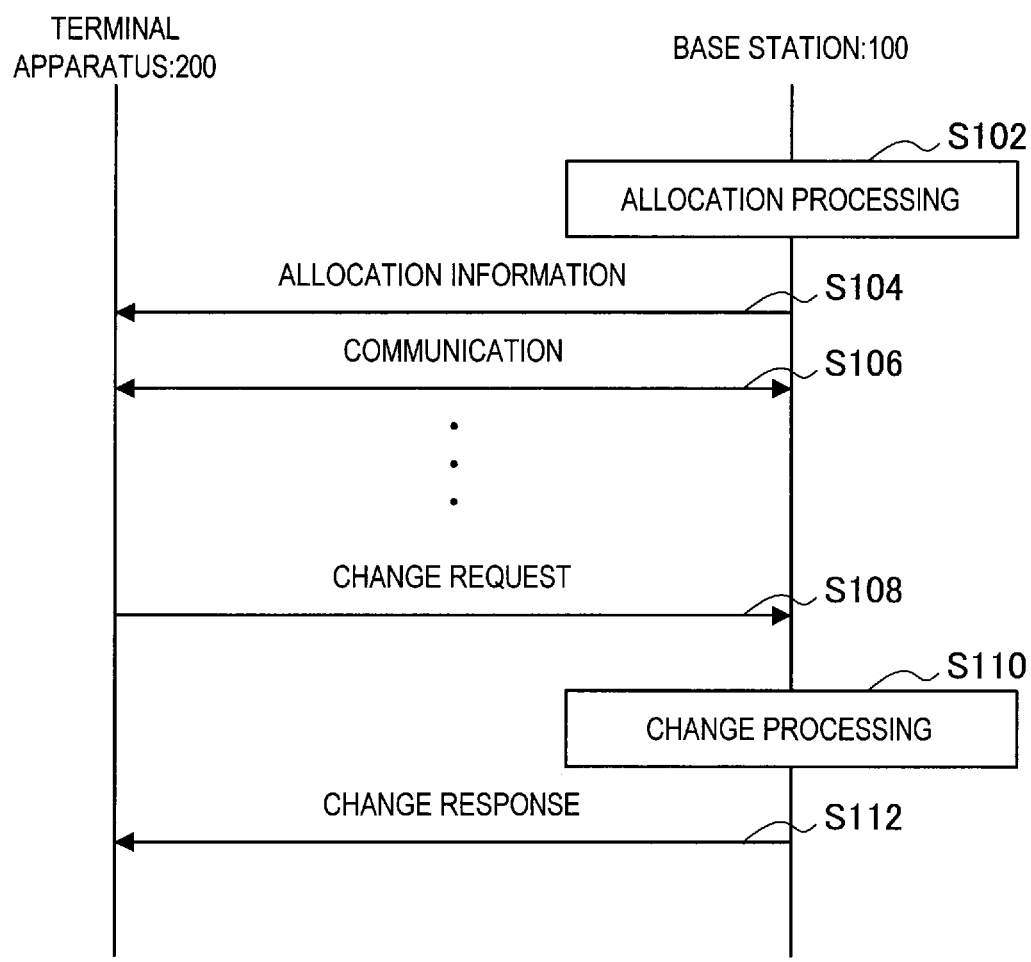

[Fig. 11]
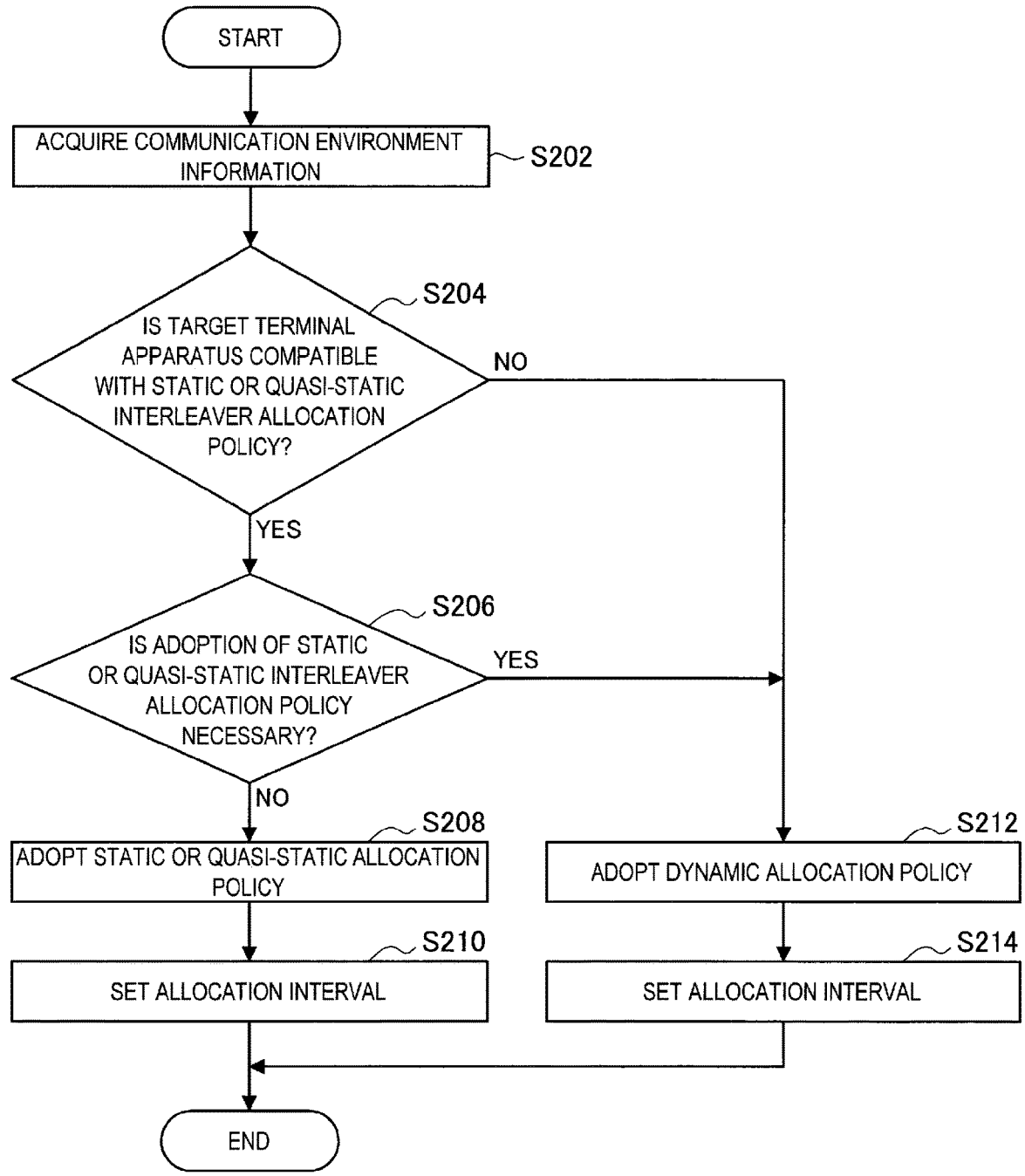

[Fig. 12]
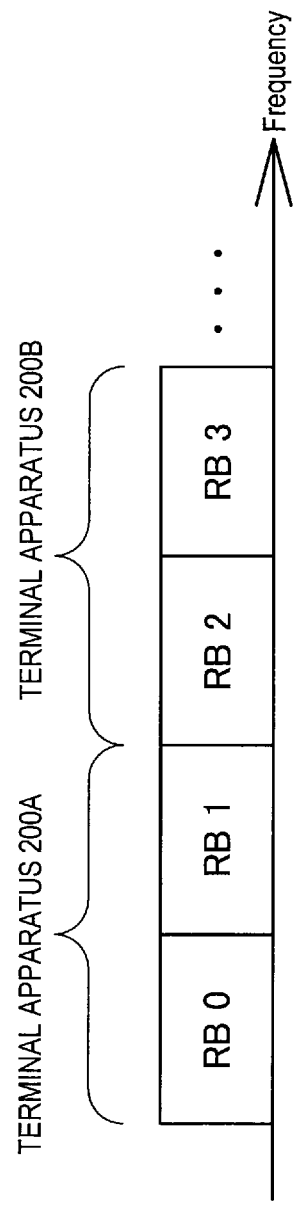

[Fig. 13]
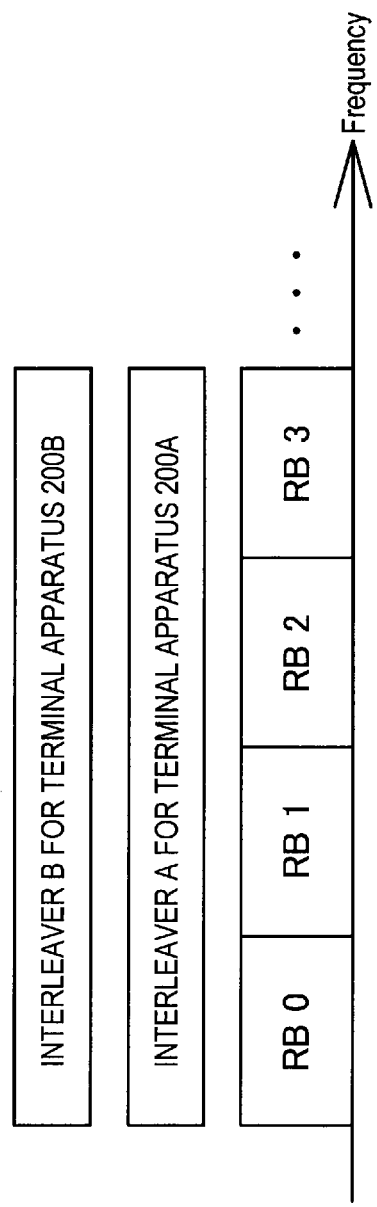

[Fig. 14]
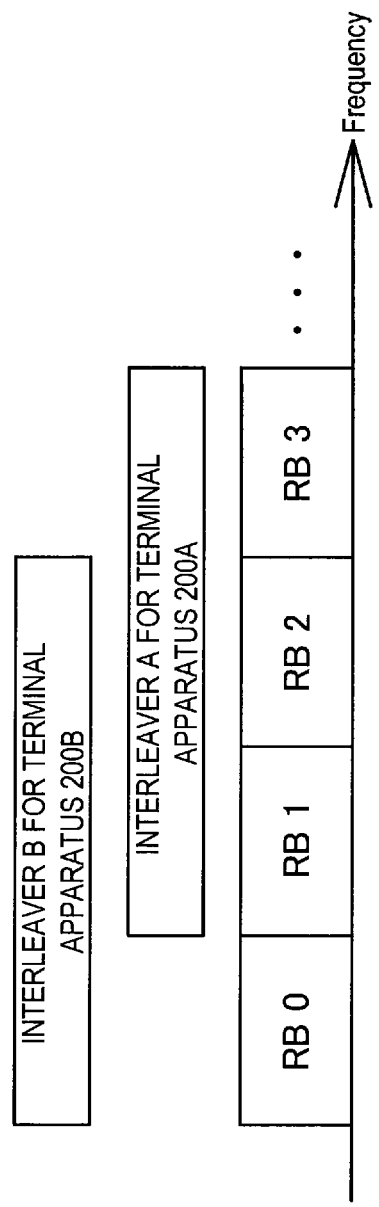

[Fig. 15]
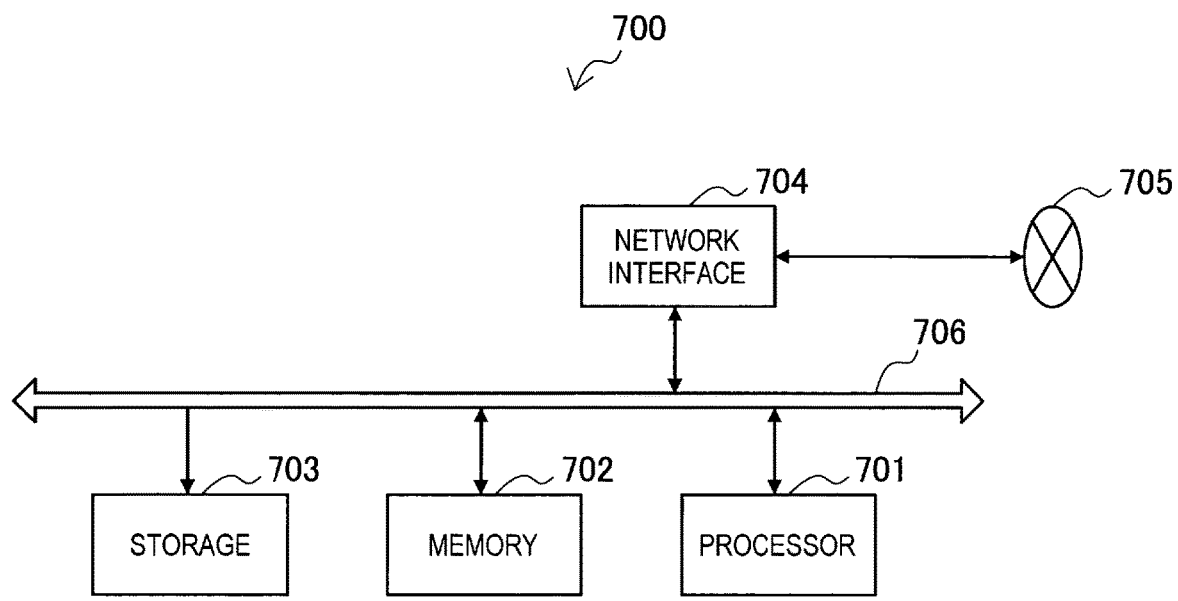

[Fig. 16]
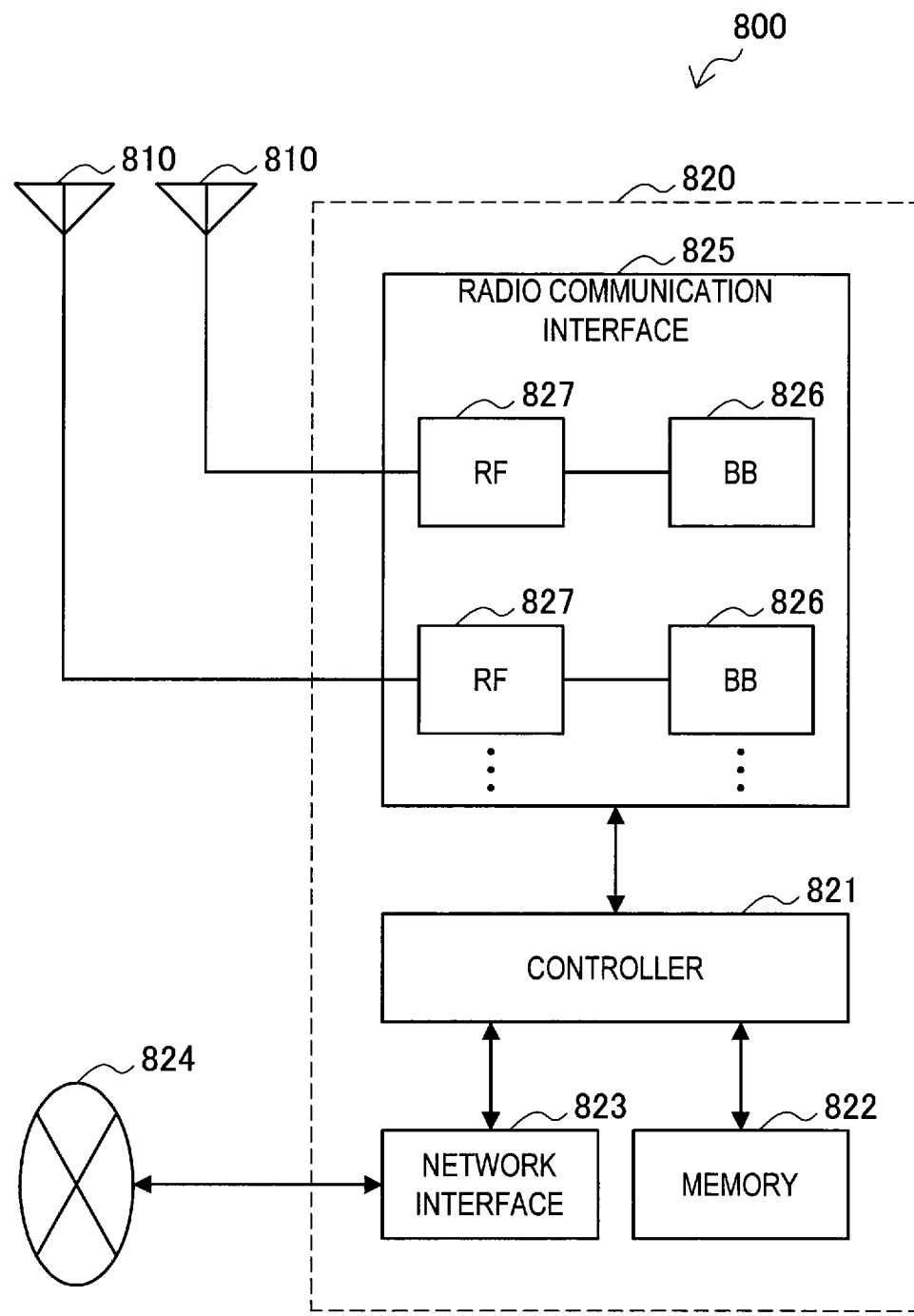

[Fig. 17]
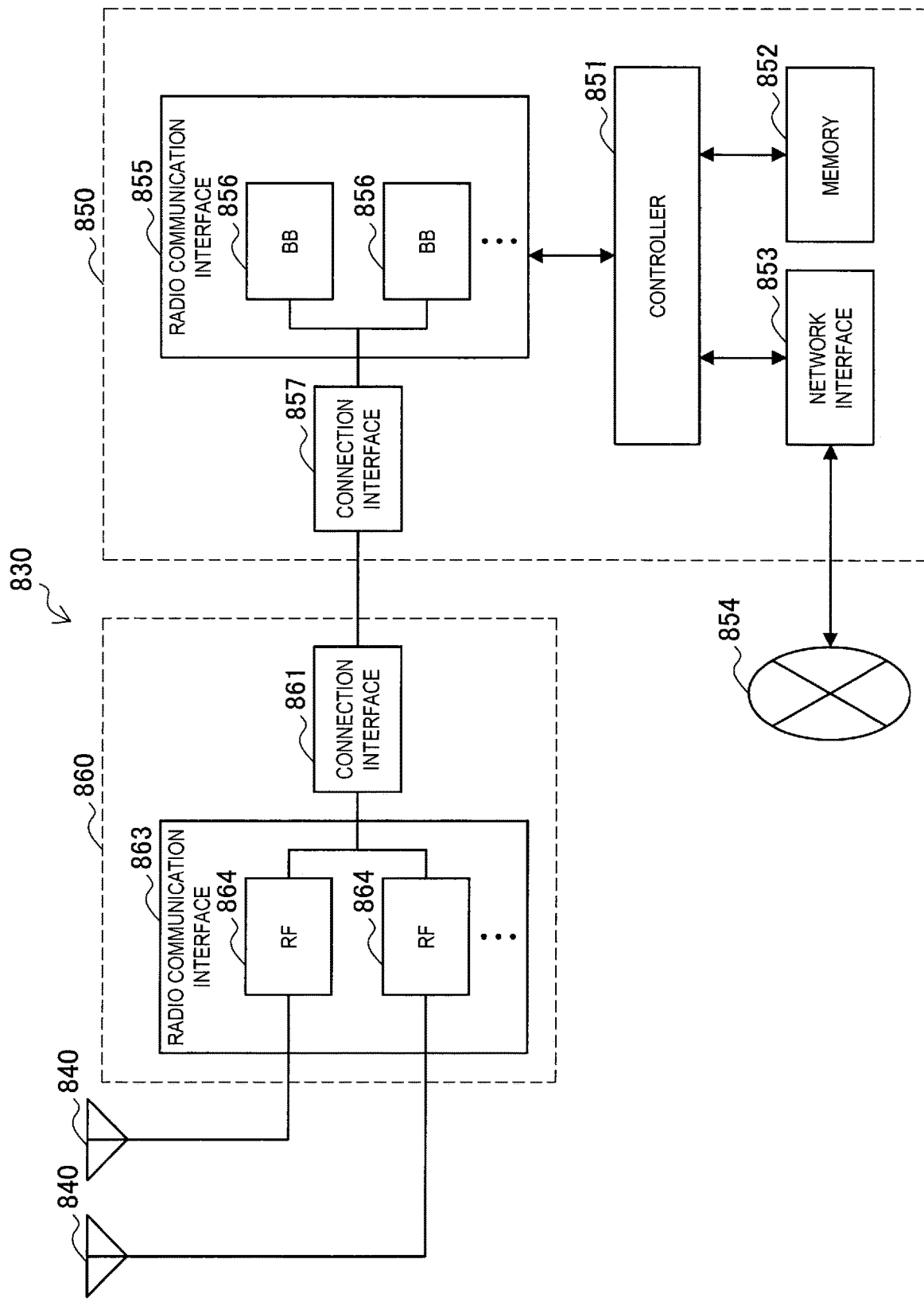

[Fig. 18]
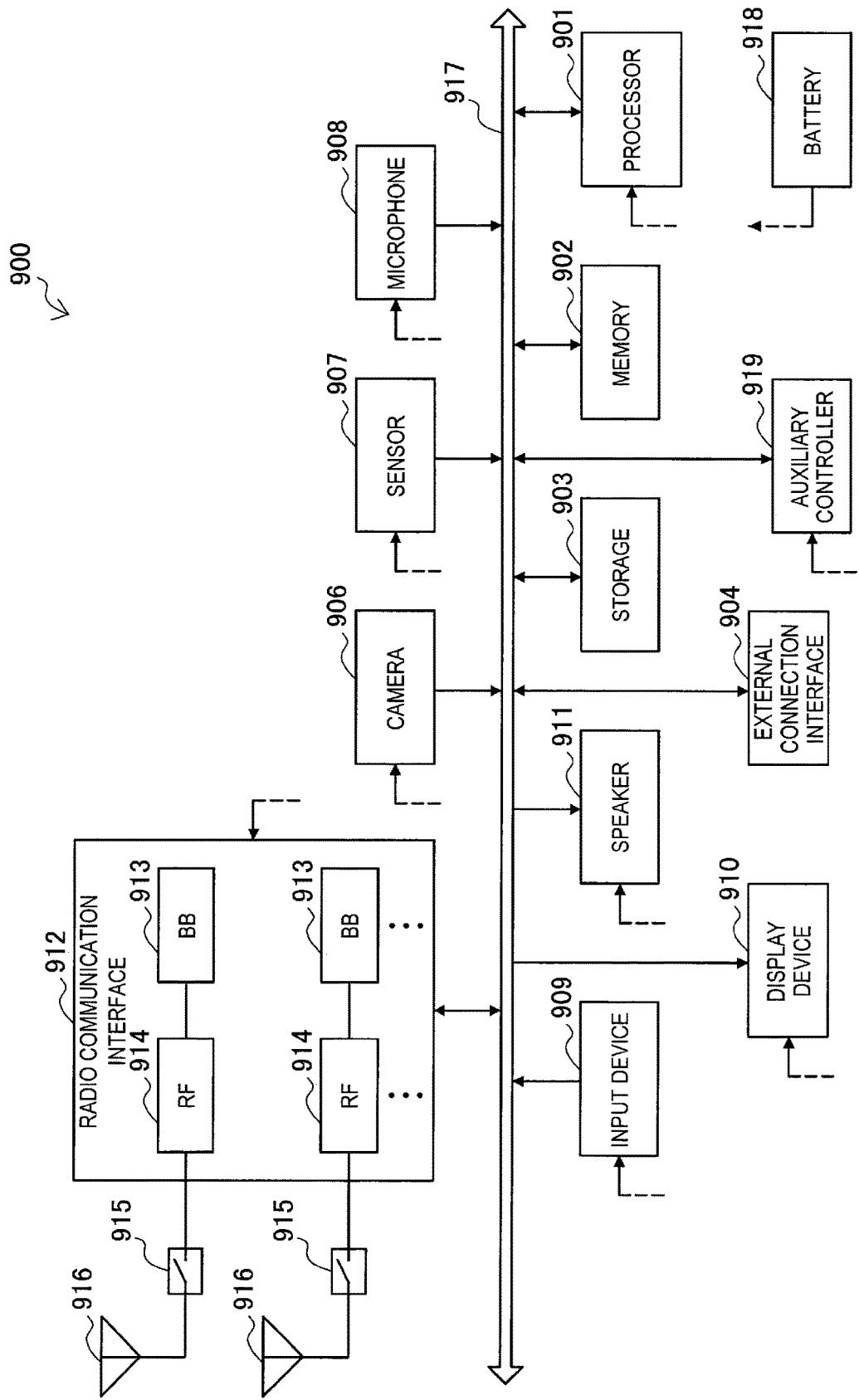

[Fig. 19]
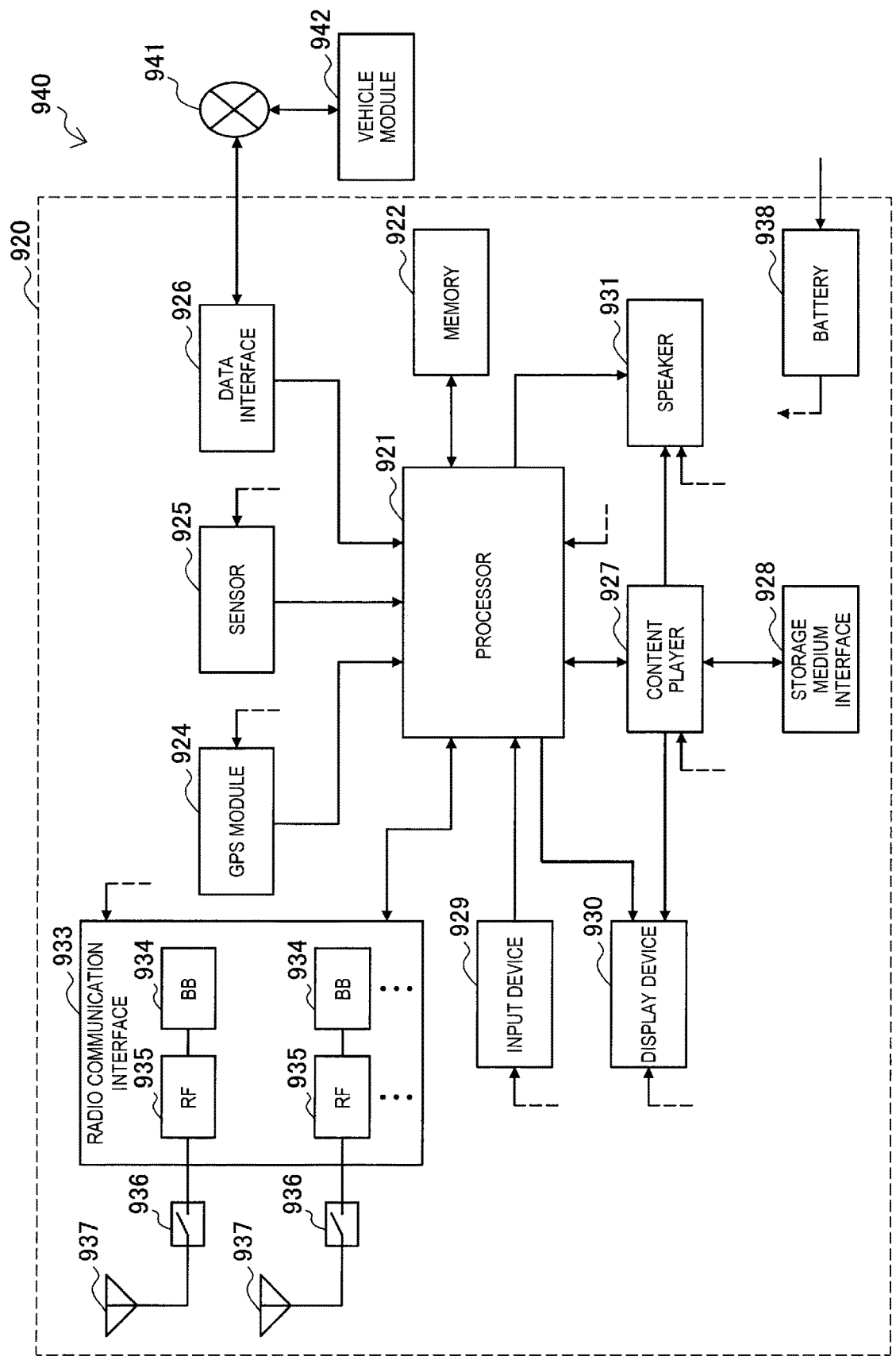

COMMUNICATION CONTROL APPARATUS, RADIO COMMUNICATION APPARATUS, COMMUNICATION CONTROL METHOD, RADIO COMMUNICATION METHOD, AND PROGRAM

CROSS REFERENCE TO RELATED APPLICATIONS

This application claims the benefit of Japanese Priority Patent Application JP 2014-250717 filed Dec. 11, 2014, the entire contents of which are incorporated herein by reference.

TECHNICAL FIELD

The present disclosure relates to a communication control apparatus, a radio communication apparatus, a communication control method, a radio communication method, and a program.

BACKGROUND ART

The number of users in cellular systems has significantly increased. Accordingly, systems of 5th Generation have been increasingly demanded. Shifting from 4th Generation to 5th Generation demands some breakthroughs (e.g., improvement of both spectral efficiency and energy efficiency, and advanced radio frequency domain processing). In cellular systems, scheduling of radio resources is performed for the purpose of avoiding interference between users, improving communication quality, and improving throughput. This scheduling has generally been performed every minimum transmission time interval (TTI), for example, in accordance with the communication environment at that time. Regarding this point, in long term evolution (LTE) and LTE-advanced (A), semi-persistent scheduling (SPS) has been standardized as a technology for scheduling radio resources in NPLs 1 and 2 below. SPS is a technology capable of allocating radio resources to user equipment (UE) at time intervals longer than one subframe. Note that the minimum TTI is 1 ms (one subframe) in LTE.

In terms of improving spectral efficiency, a multiple access technology (MAT) is an important element. As one of multiple access technologies, non-orthogonal multiple access (NOMA), such as interleave division multiple access (IDMA), has been attracting attention. Regarding IDMA, technologies related to interleaver allocation have been developed for the purpose of distinguishing between different users and effectively eliminating interference between the users to improve communication capability. For example, PTL 1 below discloses a technology of using different interleave patterns for different users or different cells to improve communication capability.

CITATION LIST

Patent Literature

PTL 1: JP 2004-194288A

Non Patent Literature

NPL 1: 3GPP, "3GPP TS 36.321 v12.3.0", Sep. 23, 2014.
NPL 2: 3GPP, "3GPP TS 36.331 v12.3.0", Sep. 23, 2014.

SUMMARY

Technical Problem

The above-described SPS is a technology having been standardized for the purpose of reducing overhead for resource allocation in each minimum TTI. For example, in LTE and LTE-A, downlink allocation messages or uplink grant messages are exchanged every subframe on a control channel. Thus, frequent interactions on the control channel cause high overhead in some cases. This can also occur in IDMA systems.

An embodiment of the present disclosure provides a novel and improved communication control apparatus, radio communication apparatus, communication control method, radio communication method, and program that are capable of reducing overhead related to interleaver allocation in an IDMA system.

Solution to Problem

According to an embodiment of the present disclosure, there is provided a communication control apparatus including: a communication unit configured to perform communication with a radio communication apparatus of a communication system in which interleave division multiple access (IDMA) is used; and an interval control unit configured to dynamically change an interval of allocation of an interleaver used for IDMA by the radio communication apparatus.

According to an embodiment of the present disclosure, there is provided a radio communication apparatus including: a radio communication unit configured to perform radio communication using IDMA with another radio communication apparatus; and a control unit configured to control the radio communication unit to cause the radio communication unit to perform interleave processing using an interleaver allocated at an interval that is dynamically changed.

According to an embodiment of the present disclosure, there is provided a communication control method including: performing communication with a radio communication apparatus of a communication system in which IDMA is used; and dynamically changing, by a processor, an interval of allocation of an interleaver used for IDMA by the radio communication apparatus.

According to an embodiment of the present disclosure, there is provided a radio communication method including: performing radio communication using IDMA with another radio communication apparatus; and performing control, by a processor, to cause interleave processing using an interleaver allocated at an interval that is dynamically changed to be performed.

According to an embodiment of the present disclosure, there is provided a program causing a computer to function as: a communication unit configured to perform communication with a radio communication apparatus of a communication system in which IDMA is used; and an interval control unit configured to dynamically change an interval of allocation of an interleaver used for IDMA by the radio communication apparatus.

According to an embodiment of the present disclosure, there is provided a program causing a computer to function as: a radio communication unit configured to perform radio communication using IDMA with another radio communication apparatus; and a control unit configured to control the radio communication unit to cause the radio communication unit to perform interleave processing using an interleaver allocated at an interval that is dynamically changed.

Advantageous Effects of Invention

As described above, according to an embodiment of the present disclosure, overhead related to interleaver allocation in an IDMA system can be reduced. Note that the effects described above are not necessarily limited, and along with or instead of the effects, any effect that is desired to be introduced in the present specification or other effects that can be expected from the present specification may be exhibited.

BRIEF DESCRIPTION OF DRAWINGS

FIG. 1 is an explanatory diagram for describing a technology related to IDMA.

FIG. 2 is an explanatory diagram for describing a technology related to IDMA.

FIG. 3 is an explanatory diagram for describing a technology related to IDMA.

FIG. 4 is an explanatory diagram for describing a technology related to IDMA.

FIG. 5 is a view illustrating an example of the entire configuration of a communication system according to an embodiment of the present disclosure.

FIG. 6 is a block diagram illustrating an example of a logical configuration of a communication control apparatus according to the present embodiment.

FIG. 7 is an explanatory diagram for describing interleaver allocation policies according to the present embodiment.

FIG. 8 is a block diagram illustrating an example of a logical configuration of a terminal apparatus according to the present embodiment.

FIG. 9 is a block diagram illustrating an example of a logical configuration of a radio communication unit of a terminal apparatus according to the present embodiment.

FIG. 10 is a sequence diagram illustrating an example of the flow of notification processing of allocation information executed in a communication system according to the present embodiment.

FIG. 11 is a flowchart illustrating an example of the flow of setting processing of an interleaver allocation interval executed in a communication control apparatus according to the present embodiment.

FIG. 12 is an explanatory diagram for describing resource allocation in OFDMA.

FIG. 13 is an explanatory diagram for describing resource allocation when OFDMA and IDMA are combined.

FIG. 14 is an explanatory diagram for describing resource allocation when OFDMA and IDMA are combined.

FIG. 15 is a block diagram illustrating an example of a schematic configuration of a server.

FIG. 16 is a block diagram illustrating a first example of a schematic configuration of an eNB.

FIG. 17 is a block diagram illustrating a second example of a schematic configuration of an eNB.

FIG. 18 is a block diagram illustrating an example of a schematic configuration of a smartphone.

FIG. 19 is a block diagram illustrating an example of a schematic configuration of a car navigation apparatus.

DESCRIPTION OF EMBODIMENTS

Hereinafter, preferred embodiments of the present disclosure will be described in detail with reference to the appended drawings. Note that, in this specification and the appended drawings, structural elements that have substantially the same function and structure are denoted with the same reference signs, and repeated explanation of these structural elements is omitted.

Note that, in this specification and the appended drawings, elements that have substantially the same function and structure are sometimes distinguished from each other using different alphabets after the same reference sign. For example, if necessary, elements that have substantially the same function and structure (e.g., terminal apparatuses 200A, 200B, and 200C) are distinguished from each other. However, when it is not particularly necessary to distinguish elements that have substantially the same function and structure, the same reference sign alone is attached. For example, when it is not particularly necessary to distinguish the terminal apparatuses 200A, 200B, and 200C from each other, each apparatus is simply called a terminal apparatus 200.

Description is given in the following order.
1. Introduction
2. Configuration
2.1. Example Configuration of Communication System
2.2. Example Configuration of Communication Control Apparatus
2.3. Example Configuration of Terminal Apparatus
3. Function Details
4. Operation Processing
5. Modification Examples
6. Application Examples
7. Conclusion

1. INTRODUCTION

First, technologies related to IDMA are described with reference to FIGS. 1 to 4. FIGS. 1 to 4 are explanatory diagrams for describing the technologies related to IDMA.

Non-orthogonal multiple access has been attracting attention as one of 5G radio access technologies following long term evolution (LTE)/LTE-advanced (LTE-A).

In orthogonal frequency division multiple access (OFDMA) or single-carrier FDMA (SC-FDMA) adopted in LTE, radio resources are allocated so as not to overlap between user terminals within a cell. Note that radio resources are resources of frequency or time for radio communication, which include various types such as a resource block, a subframe, and a resource element. Such a radio access technology of allocating radio resources so that they do not overlap is also called orthogonal multiple access.

Here, FIG. 1 illustrates an example of allocation of radio resources in orthogonal multiple access. In FIG. 1, the horizontal axis indicates frequency, and radio resources allocated to different users are shown by different colors. As illustrated in FIG. 1, resource blocks (RBs) different in the frequency direction, for example, can be allocated to users in orthogonal multiple access.

In contrast, in non-orthogonal multiple access, at least partly overlapping radio resources are allocated to user terminals within a cell. In the case where non-orthogonal multiple access is adopted, signals transmitted and received by user terminals within a cell can interfere with each other in a wireless space. The receiving side, however, is able to acquire information for each user through predetermined decoding processing. It is theoretically known that non-orthogonal multiple access achieves higher communication capability (or cell communication capability) than orthogonal multiple access when the allocation of radio resources is performed appropriately.

Here, FIG. 2 illustrates an example of allocation of radio resources in non-orthogonal multiple access. In FIG. 2, the horizontal axis indicates frequency, and radio resources allocated to different users are shown by different colors. As illustrated in FIG. 2, resource blocks overlapping in the frequency direction, for example, can be allocated to users in non-orthogonal multiple access.

IDMA is one of radio access technologies categorized as non-orthogonal multiple access. In IDMA, to identify user signals, different interleave patterns, which are used for interleave processing that a transmitting-side apparatus performs on transmission signals, are allocated to different users. A receiving-side apparatus decodes user signals separately by using de-interleave patterns corresponding to the interleave patterns allocated to the respective users. An advantage of IDMA is a light load of signal processing by the transmitting-side apparatus. This advantage is particularly emphasized in uplink (UL) from a user terminal to a base station.

Here, FIG. 3 illustrates a basic example configuration of a transmitting station 10 that performs radio communication using IDMA. As illustrated in FIG. 3, the transmitting station 10 includes an error correction encoding circuit 11, an interleaver ($\pi_i$) 12, a digital modulation circuit 13, and a radio frequency (RF) circuit 14. The error correction encoding circuit 11 performs error correction encoding on an information bit string of a user i. The interleaver ($\pi_i$) 12, which is an interleaver allocated for the user i, performs interleave processing on the information bit string that has been subjected to error correction encoding. The digital modulation circuit 13 digitally modulates the information bit string that has gone through interleave processing. The RF circuit 14 performs various kinds of signal processing on a signal after digital modulation, and transmits a radio signal via an antenna. Note that interleaver allocation is performed by allocating at least one of an interleaver type and an interleave pattern.

An interleaver type, which means a type of interleaver, is a policy of an interleave pattern used by an interleaver. Correlation characteristics are maintained between interleave patterns of the same interleaver type. In contrast, correlation characteristics are unknown between interleave patterns of different interleaver types. Therefore, it is preferred to allocate different interleave patterns of the same interleaver type for users between which interference can occur.

FIG. 4 illustrates a basic example configuration of a receiving station 20 that performs radio communication using IDMA. As illustrated in FIG. 4, the receiving station 20 includes an RF circuit 21, a signal separation circuit 22, and decoding circuits 23. The RF circuit 21 performs various kinds of signal processing on a radio signal received by an antenna, and outputs the resulting signal to the signal separation circuit 22. The signal separation circuit 22 has a function of separating a composite signal, in which signals of users are combined, into signals for the respective users, and outputs each user signal obtained by the separation to the corresponding decoding circuit 23. For example, the decoding circuit 23i includes a de-interleaver ($\pi_i^{-1}$) 24 for a user i, an error correction decoding circuit 25, and an interleaver ($\pi_i$) 26 for the user i. The decoding circuit 23i, to which a user signal from the user i is input, performs de-interleave processing by the de-interleaver ($\pi_i^{-1}$) 24 and decoding by the error correction decoding circuit 25. The decoding circuit 23i outputs the decoded signal as an information bit string of the user i when decoding has been performed correctly. In addition, the decoding circuit 23i performs interleave processing by the interleaver ($\pi_i$) 26 on the decoded signal, and returns the resulting signal as a user signal for the user i to the signal separation circuit 22. Such returning of a user signal is performed for all the user signals. The signal separation circuit 22 performs signal separation again using returned user signals, and outputs user signals after the separation to the decoding circuits 23 again. The receiving station 20 repeats the signal processing by the signal separation circuit 22 and the decoding circuits 23, thereby decoding user signals. Such decoding of user signals from a multiple signal is also called multi user detection below.

2. CONFIGURATION

2.1. Example Configuration of Communication System

FIG. 5 illustrates an example of the entire configuration of a communication system according to an embodiment of the present disclosure. As illustrated in FIG. 5, a communication system 1 according to the present embodiment includes a communication control apparatus 100 and a terminal apparatus 200.

The communication control apparatus 100 is an apparatus that coordinately controls communication within the communication system 1. The communication control apparatus 100 may be implemented as a logical entity included as one of functions in another apparatus or may be implemented as a physical entity such as a server. In the example illustrated in FIG. 5, the communication control apparatus 100 is a logical entity included in a base station. The base station 100 is a radio communication apparatus that provides a radio communication service for one or more terminal apparatuses 200 located inside a cell 300, and transmits and receives data to/from the terminal apparatuses 200. For example, the base station 100 is an evolutional Node B (eNB) or an access point in a cellular system. The base station 100 is connected to a core network 400. The core network 400 is connected to a packet data network (PDN) via a gateway apparatus. The cell 300 may be operated in accordance with any radio communication scheme, such as long term evolution (LTE), LTE-advanced (LTE-A), GSM (registered trademark), UMTS, W-CDMA, CDMA2000, WiMAX, WiMAX2, or IEEE802.16.

The terminal apparatus 200 is a radio communication apparatus that is provided with the radio communication service by the base station 100, and transmits and receives data to/from the base station 100. For example, the terminal apparatus 200 is a user terminal (user equipment (UE)) in a cellular system.

IDMA is used in the communication system 1. In other words, the base station 100 and the terminal apparatus 200 perform radio communication using IDMA. At that time, the base station 100 allocates interleavers to be used in uplink communication or downlink communication with the terminal apparatuses 200A and 200B. The communication control apparatus 100 allocates interleavers suitable for communication with the terminal apparatuses 200A and 200B, thereby allowing multiplexing of user signals.

The terminal apparatus 200C may have a function as the communication control apparatus 100. In that case, the terminal apparatus 200C allocates interleavers to be used in device to device (D2D) communication with the terminal apparatuses 200D and 200E.

2.2. Example Configuration of Communication Control Apparatus

FIG. 6 is a block diagram illustrating an example of a logical configuration of the communication control apparatus 100 according to the present embodiment. As illustrated in FIG. 6, the communication control apparatus 100 includes a radio communication unit 110, a network communication unit 120, a storage unit 130, and a control unit 140. Described here is an example configuration when the communication control apparatus 100 is implemented as a base station.

(1) Radio Communication Unit 110

The radio communication unit 110 executes radio communication with the terminal apparatus 200 connected to the cell 300. For example, the radio communication unit 110 receives uplink traffic from the terminal apparatus 200, and transmits downlink traffic to the terminal apparatus 200. In addition, the radio communication unit 110 broadcasts a synchronization signal and a reference signal in downlink. The synchronization signal is used for the terminal apparatus 200 to achieve synchronization with the cell 300. The reference signal is used for measuring communication quality. The communication quality measured using the reference signal serves as, for example, an indicator for handover determination that triggers handover between cells. Specific examples of the reference signal include a common reference signal (CRS) and a channel state information reference signal (CSI-RS). The radio communication unit 110 also controls its transmission processing and reception processing by using allocation information described later, notification of which has been given from the control unit 140. Furthermore, the radio communication unit 110 transmits this allocation information to the terminal apparatus 200. As illustrated in FIG. 6, the radio communication unit 110 includes a physical layer controller 112 and an interleave unit 114.

(1-1) Physical Layer Controller 112

The physical layer controller 112 has a function of controlling processing related to a physical layer in the radio communication unit 110, based on control by the control unit 140. For example, the physical layer controller 112 controls, based on allocation information, parameters for an error correcting code, modulation, an interleaver, and the like related to transmission processing. The physical layer controller 112 also controls, based on allocation information, parameters for signal separation, demodulation, a de-interleaver, and the like related to reception processing.

(1-2) Interleave Unit 114

The interleave unit 114 has a function of performing interleave processing or deinterleave processing in the radio communication unit 110. For example, the interleave unit 114 includes the interleaver 12, and configures the interleaver 12 using an interleaver type and an interleave pattern set by the physical layer controller 112. In addition, the interleave unit 114 includes the signal separation circuit 22 and the decoding circuits 23, and configures the de-interleavers 24 using a de-interleaver type and a de-interleave pattern set by the physical layer controller 112.

(2) Network Communication Unit 120

The network communication unit 120 is a communication interface for connecting the communication control apparatus 100 to the core network 400. The network communication unit 120 may be a wired communication interface or may be a radio communication interface. The network communication unit 120 transmits and receives data traffic to/from various controls nodes within the core network 400, and exchanges control messages.

(3) Storage Unit 130

The storage unit 130 has a function of storing various kinds of information. For example, the storage unit 130 can store allocation information, which is described later.

(4) Control Unit 140

The control unit 140 functions as an arithmetic processing apparatus and a control apparatus, and controls the whole operation within the communication control apparatus 100 in accordance with various programs. As illustrated in FIG. 6, the control unit 140 includes an interval control unit 142, an allocation control unit 144, and a communication control unit 146.

(4-1) Interval Control Unit 142

The interval control unit 142 has a function of dynamically changing the interval of allocation of an interleaver used for IDMA by the terminal apparatus 200. Specifically, the interval control unit 142 dynamically changes the interval at which the allocation control unit 144 performs interleaver allocation.

For example, the interval control unit 142 may change an interleaver allocation interval to a time equal to the minimum TTI. Allocating an interleaver at an interval equal to the minimum TTI is also called a dynamic allocation policy below. The dynamic allocation policy is similar to an allocation policy in resource scheduling in a cellular system. The interval control unit 142 may change an interleaver allocation interval to a time longer than the minimum TTI. Allocating an interleaver at an interval longer than the minimum TTI is also called a static or quasi-static allocation policy below. An interleaver allocation interval is a finite value in the case of a quasi-static allocation policy, and is infinite in the case of a static allocation policy. That is, the communication control apparatus 100 performs interleaver allocation alone in the case of a quasi-static allocation policy, and does not perform interleaver allocation alone in the case of a static allocation policy. As will be described later, the communication control apparatus 100 may be caused to perform interleaver allocation by an external factor, such as a request from the terminal apparatus 200, while adopting a static allocation policy. Interleaver allocation policies, e.g., dynamic, static, and quasi-static, are described below in further detail with reference to FIG. 7.

FIG. 7 is an explanatory diagram for describing interleaver allocation policies according to the present embodiment. The reference sign "510" indicates changes in the allocated interleaver in the case of a dynamic allocation policy. As indicated by "510", the allocated interleaver is changed every minimum TTI in the dynamic allocation policy. Here, a, indicates an interleaver of an index i. The reference sign "520" indicates changes in the allocated interleaver in the case of a quasi-static allocation policy. As indicated by "520", the allocated interleaver is changed at an interval longer than the minimum TTI in the quasi-static allocation policy. The reference sign "530" indicates changes in the allocated interleaver in the case of a static allocation policy. As indicated by "530", the allocated interleaver is not changed in the static allocation policy.

The interval control unit 142 may change an interleaver allocation interval by dynamically switching interleaver allocation policies, e.g., dynamic, static, and quasi-static, or may dynamically change the allocation interval while keeping the allocation policy. Here, in a dynamic allocation policy, transmission and reception of control messages related to interleaver allocation occur every minimum TTI between the communication control apparatus 100 and the terminal apparatus 200. Regarding this point, in a static or quasi-static allocation policy, transmission and reception of control messages can be reduced, resulting in reduced overhead, because interleaver allocation is performed at an interval longer than the minimum TTI. Accordingly, the interval control unit 142 can reduce overhead by switching the interleaver allocation policy from a dynamic allocation policy to a static or quasi-static allocation policy. Note that the interval control unit 142 may set a different allocation policy or allocation interval or the same allocation policy or allocation interval for each of the terminal apparatuses 200.

The interval control unit 142 may change the interval based on information related to communication by the base station 100 and the terminal apparatus 200. The information related to communication by the base station 100 and the terminal apparatus 200 is also called communication environment information below. For example, the interval control unit 142 can acquire the communication environment information from another base station 100 or terminal apparatus 200 or another control apparatus or the like. As is described below, various kinds of communication environment information are conceivable.

For example, the communication environment information may include identification information that is temporarily given to the terminal apparatus 200 for control. For example, in a cellular system, an example of such identification information is a radio network temporal identifier (RNTI).

For example, the communication environment information may include identification information unique to the terminal apparatus 200. For example, such identification information may be physical identification information linked to the terminal apparatus 200, or may be a Subscriber ID or the like registered by a network operator in a cellular system.

For example, the communication environment information may include capability information of the terminal apparatus 200. For example, the capability information includes information indicating a radio access technology (RAT) with which the terminal apparatus 200 is compatible. In the present embodiment, the capability information can include information indicating whether or not the terminal apparatus 200 is compatible with IDMA and whether or not, if compatible with IDMA, the terminal apparatus 200 is compatible with a static or quasi-static interleaver allocation policy according to the present embodiment.

For example, the communication environment information may include information indicating a state of packet traffic of the terminal apparatus 200. For example, the information indicating a state of packet traffic can include information indicating whether the terminal apparatus 200 is in an idle state or performing transmission and reception.

For example, the communication environment information may include information on a state of interleaver allocation. For example, the information on a state of interleaver allocation can include information indicating an interleaver allocation policy (i.e., information indicating whether the allocation policy is dynamic, quasi-static, or static) and time elapsed from the previous interleaver allocation.

For example, the communication environment information may include information indicating a statistic related to a packet transmitted or received by the terminal apparatus 200. Examples of the information indicating a statistic related to a packet include the average size, communication elapsed time, and the peak size of a packet during communication.

For example, the communication environment information may include information indicating the category of an application used by the terminal apparatus 200. Examples of categories of applications are applications that perform data communication, applications that make phone calls, and applications that only keep connection. In the case of applications that perform data communication, the category of the applications may be subdivided into more specific categories such as streaming, live streaming, text, images, moving images, and games (cloud/real time). Similarly, in the case of applications that make phone calls, the category of the applications may be subdivided into more specific categories such as voice calls and video calls.

For example, the communication environment information may include information indicating a trigger of switching between application types. Examples of the trigger of switching between application types are reception of a paging message addressed to the terminal apparatus 200 and a response message by the terminal apparatus 200.

For example, the communication environment information may include a quality of service class identifier (QCI). A QCI is a label related to QoS that a bearer has. As is described in "LTE—The UMTS Long Term Evolution from Theory to Practice (Second edition)" by Stefania Sesia, Issam Toufik, and Matthew Baker, Wiley, 2011, QCIs in LTE are defined as in Table 1 below.

TABLE 1

| QCI | Resource Type | Priority | Packet Delay budget [ms] | PER (Packet error loss rate) | Example service |
|---|---|---|---|---|---|
| 1 | Minimum Guaranteed Bit Rate (GBR) | 2 | 100 | $10^{-2}$ | Conversational voice |
| 2 | GBR | 4 | 150 | $10^{-3}$ | Conversational video (live streaming) |
| 3 | GBR | 5 | 300 | $10^{-6}$ | Non-conversational video (buffered streaming) |
| 4 | GBR | 3 | 50 | $10^{-3}$ | Real time gaming |
| 5 | Non-GBR | 1 | 100 | $10^{-6}$ | IMS signaling |
| 6 | Non-GBR | 7 | 100 | $10^{-3}$ | Voice, video (live streaming), interactive gaming |
| 7 | Non-GBR | 6 | 300 | $10^{-6}$ | Video (buffered streaming) |
| 8 | Non-GBR | 8 | 300 | $10^{-6}$ | TCP-based (e.g. WWW, e-mail), chat, FTP, p2p file sharing |
| 9 | Non-GBR | 9 | 300 | $10^{-6}$ | |

For example, the above-described overhead caused by frequent interaction on a control channel can be a problem in operating services where the packet size is small, a fluctuation of packet size is static or quasi-static, or communication occurs periodically, such as Voice over IP (VoIP) and Voice over LTE (VoLTE). Thus, when operation of such a service is assumed based on communication environment information, the interval control unit 142 changes the allocation policy to a static or quasi-static allocation policy, thereby reducing overhead effectively. In addition, the interval control unit 142 can reduce overhead effectively by changing the allocation policy to a static or quasi-static allocation policy under various situations. Specific scenarios will be described in detail later.

(4-2) Allocation Control Unit 144

The allocation control unit 144 has a function of allocating an interleaver at an interval set by the interval control unit 142. For example, the allocation control unit 144 allocates at least one of an interleaver type and an interleave pattern to each of the terminal apparatuses 200 at an interval set by the interval control unit 142.

The allocation control unit 144 may allocate an interleaver based on information related to communication by the base station 100 and the terminal apparatus 200. In other words, the allocation control unit 144 may allocate an interleaver based on communication environment information, like the interval control unit 142. For example, the allocation control unit 144 can allocate an interleaver based on a QCI. Alternatively, the allocation control unit 144 may allocate an interleaver in accordance with an allocation rule corresponding to the communication environment information. For example, the allocation control unit 144 can adopt an interleaver type corresponding to a QCI and allocate an interleave pattern of the interleaver type. Specific scenarios will be described in detail later.

(4-3) Communication Control Unit 146

The communication control unit 146 has a function of controlling communication of the radio communication unit 110 with the terminal apparatus 200. For example, the communication control unit 146 notifies the radio communication unit 110 of information indicating an interleaver allocation policy in the interval control unit 142, information indicating an allocation interval set by the interval control unit 142, and information indicating an interleaver allocated by the allocation control unit 144. Such information is also collectively called allocation information below. The communication control unit 146 may control the radio communication unit 110 to cause the radio communication unit 110 to notify the terminal apparatus 200 of the allocation information using a control signal or a control channel.

The communication control unit 146 also has a function of controlling the radio communication unit 110 to cause the radio communication unit 110 to perform interleave processing using an interleaver allocated by the allocation control unit 144 at an interval dynamically changed by the interval control unit 142. Specifically, the communication control unit 146 controls the physical layer controller 112 to cause the physical layer controller 112 to set the interleaver 12, the de-interleavers 24, and the interleavers 26 in accordance with the allocation information. This control allows the communication control apparatus 100 to perform radio communication using IDMA with the terminal apparatus 200.

The example configuration of the communication control apparatus 100 according to the present embodiment has been described. Next, an example configuration of the terminal apparatus 200 according to the present embodiment is described with reference to FIGS. 8 and 9.

2.3. Example Configuration of Terminal Apparatus

FIG. 8 is a block diagram illustrating an example of a logical configuration of the terminal apparatus 200 according to the present embodiment. As illustrated in FIG. 8, the terminal apparatus 200 includes a radio communication unit 210, a storage unit 220, and a control unit 230.

(1) Radio Communication Unit 210

The radio communication unit 210 executes radio communication with the base station 100. For example, the radio communication unit 210 receives downlink traffic from the base station 100, and transmits uplink traffic to the base station 100. In addition, the radio communication unit 210 receives a synchronization signal and a reference signal that have been broadcasted in downlink from the base station 100. The radio communication unit 210 achieves synchronization with the cell 300 using the received synchronization signal. The radio communication unit 210 measures communication quality using the reference signal. The radio communication unit 210 also receives allocation information from the communication control apparatus 100. The radio communication unit 210 controls its transmission processing and reception processing by using the received allocation information. As illustrated in FIG. 8, the radio communication unit 210 includes a physical layer controller 212 and an interleave unit 214.

(1-1) Physical Layer Controller 212

The physical layer controller 212 has a function of controlling processing related to a physical layer in the radio communication unit 210, based on control by the control unit 230. For example, the physical layer controller 212 controls, based on allocation information, parameters for an error correcting code, modulation, an interleaver, and the like related to transmission processing. The physical layer controller 212 also controls, based on allocation information, parameters for signal separation, demodulation, a de-interleaver, and the like related to reception processing.

(1-2) Interleave Unit 214

The interleave unit 214 has a function of performing interleave processing or de-interleave processing in the radio communication unit 210. For example, the interleave unit 214 includes the interleaver 12, and configures the interleaver 12 using an interleaver type and an interleave pattern set by the physical layer controller 212. In addition, the interleave unit 214 includes the signal separation circuit 22 and the decoding circuits 23, and configures the de-interleavers 24 using a de-interleaver type and a de-interleave pattern set by the physical layer controller 212.

Here, the relation between the physical controller 212 and the interleave unit 214 is described in further detail with reference to FIG. 9. FIG. 9 is a block diagram illustrating an example of a logical configuration of the radio communication unit 210 of the terminal apparatus 200 according to the present embodiment. As illustrated in FIG. 9, the radio communication unit 210 according to the present embodiment includes the error correction encoding circuit 11, the interleaver 12, the digital modulation circuit 13, and the RF circuit 14 for transmission. The radio communication unit 210 also includes the RF circuit 21 for reception, the signal separation circuit 22, the de-interleavers 24, the error correction decoding circuits 25, and the interleavers 26. These elements included in the radio communication unit 210 have been described above with reference to FIGS. 3 and 4 and description thereof is omitted here.

As illustrated in FIG. 9, the radio communication unit 210 includes the physical layer controller 212. The physical layer controller 212 acquires information stored in a control signal or a control channel, which has been separated by the signal separation circuit 22. For example, the physical layer controller 212 acquires allocation information transmitted by the base station 100 on a control channel. The physical layer controller 212 sets the interleaver 12, the de-interleavers 24, and the interleavers 26 in accordance with the acquired allocation information. The acquisition of the allocation information and the setting of the interleaver 12, the de-interleavers 24, and the interleavers 26 may be performed by the physical layer controller 212 alone, or may be performed in accordance with control by the control unit 230.

(2) Storage Unit 220

The storage unit 220 has a function of storing various kinds of information. For example, the storage unit 220 stores allocation information received from the base station 100 by the radio communication unit 210.

(3) Control Unit 230

The control unit 230 functions as an arithmetic processing apparatus and a control apparatus, and controls the whole operation within the terminal apparatus 200 in accordance with various programs. For example, the control unit 230 has a function of controlling the radio communication unit 210 to cause the radio communication unit 210 to perform interleave processing using an interleaver allocated at an interval dynamically changed by the communication control apparatus 100. Specifically, the control unit 230 controls the physical layer controller 212 to cause the physical layer controller 212 to set the interleaver 12, the de-interleavers 24, and the interleavers 26 in accordance with the allocation information received from the base station 100 by the radio communication unit 210. This control allows the terminal apparatus 200 to perform radio communication using IDMA with the base station 100.

The control unit 230 may continuously monitor the control channel to acquire allocation information. Alternatively, the control unit 230 may monitor the control channel at the timing of notification of allocation information, in accordance with an allocation policy and an allocation interval indicated by the allocation information. In that case, processing load, power consumption, and the like in the terminal apparatus 200 can be reduced.

Furthermore, the control unit 230 may control the radio communication unit 210 to cause the radio communication unit 210 to transmit a message requesting a change of an interleaver allocation interval or interleaver allocation, in accordance with the situation of communication by the radio communication unit 210. For example, the control unit 230 can control the radio communication unit 210 to cause the radio communication unit 210 to transmit a message requesting a change of an allocation policy, an allocation interval, or interleaver allocation to the communication control apparatus 100, in accordance with the situation of interference.

The example configuration of the terminal apparatus 200 according to the present embodiment has been described.

3. FUNCTION DETAILS

Hereinafter, a function of deciding an interleaver allocation policy by the interval control unit 142 and a function of allocating an interleaver by the allocation control unit 144 will be described in detail. Specific scenarios are given in the description.

(1) First Scenario

In cellular systems, an original service, contract, or the like of a network operator sometimes imposes some kind of limitation on a communication service enjoyed by a specific terminal apparatus 200. Examples of such a service or contract include a contract for only voice calls, a contract for a machine to machine (M2M) module, a pay-per-use contract of packet communication, and a communication speed limit. A contract for only voice calls can permit periodic communication with small data sizes. A contract for an M2M module can permit communication with small packet sizes. Under a pay-per-use contract of packet communication, transmission and reception of large-sized packets are less likely to occur because a user tries to reduce fees as much as possible. Examples of a communication speed limit include cases where transmission and reception of small-sized packets are forced, such as a contract to provide a low-speed communication service and a speed limit due to a data traffic upper limit. For example, the interval control unit 142 finds a service or contract for the terminal apparatus 200 by using identification information linked to the terminal apparatus 200, such as an RNTI or a Subscriber ID. Then, the interval control unit 142 sets the allocation policy for the terminal apparatus 200 under the above-described limitation to a static or quasi-static allocation policy. Thus, overhead for interleaver allocation can be reduced.

(2) Second Scenario

For example, the interval control unit 142 may change an interleaver allocation interval based on information indicating the category of an application used by the terminal apparatus 200. For example, when the terminal apparatus 200 uses an application where the packet size is small, a fluctuation of packet size is static or quasi-static, or communication can occur periodically, the interval control unit 142 adopts a static or quasi-static allocation policy as the allocation policy. When the terminal apparatus 200 uses an application other than such an application, the interval control unit 142 adopts a dynamic allocation policy as the allocation policy. The interval control unit 142 can determine whether or not such an application is used based on communication environment information. A determination criterion may be set arbitrarily by an operator of the communication system 1. A conceivable example of such an application is a voice call.

(3) Third Scenario

For example, the interval control unit 142 may change an interleaver allocation interval based on a QCI. For example, the interval control unit 142 can decide an interleaver allocation policy in accordance with Table 2 below.

TABLE 2

| QCI | Interleaver allocation policy | Example service |
|---|---|---|
| 1 | (quasi-)static | Conversational voice |
| 2 | (quasi-)static | Conversational video (live streaming) |
| 3 | dynamic | Non-conversational video (buffered streaming) |
| 4 | (quasi-)static | Real time gaming |
| 5 | dynamic | IMS signaling |
| 6 | (quasi-)static | Voice, video (live streaming), interactive gaming |
| 7 | dynamic | Video (buffered streaming) |
| 8 | dynamic | TCP-based (e.g. WWW, e-mail), chat, FTP, p2p file snaring |
| 9 | any | |

The term "any" in the table indicates that any policy can be adopted. Note that Table 2 is an example of association between QCIs and interleaver allocation policies, and the interval control unit 142 may decide an allocation policy in accordance with different association.

(4) Fourth Scenario

This scenario is a scenario in which an interleaver corresponding to a QCI is allocated in addition to the third scenario. Specifically, the allocation control unit 144 may allocate an interleaver based on a QCI. For example, the allocation control unit 144 allocates any interleave pattern a, from a candidate set Π of interleave patterns that can be allocated, which is expressed by Formula 1 below.

[Math.1]

$$\Pi = \{\pi_0, \pi_1, \ldots, \pi_{N_{Interleaver}-1}\} \quad \text{(Formula 1)}$$

Here, $N_{Interleaver-1}$ is the total number of interleave patterns included in the candidate set Π. For example, the allocation control unit 144 may allocate an interleaver from among candidates corresponding to a QCI in accordance with Table 3 below.

TABLE 3

| QCI | Interleaver allocation policy | Interleaver candidates | Example service |
|---|---|---|---|
| 1 | (quasi-)static | $\pi_0, \ldots, \pi_3$ | Conversational voice |
| 2 | (quasi-)static | $\pi_0, \ldots, \pi_3$ | Conversational video (live streaming) |
| 3 | dynamic | $\pi_4, \ldots, \pi_{N_{Interleaver}-1}$ | Non-conversational video (buffered streaming) |
| 4 | (quasi-)static | $\pi_0, \ldots, \pi_3$ | Real time gaming |
| 5 | dynamic | $\pi_4, \ldots, \pi_{N_{Interleaver}-1}$ | IMS signaling |
| 6 | (quasi-)static | $\pi_0, \ldots, \pi_3$ | Voice, video (live streaming), interactive gaming |
| 7 | dynamic | $\pi_4, \ldots, \pi_{N_{Interleaver}-1}$ | Video (buffered streaming) |
| 8 | dynamic | $\pi_4, \ldots, \pi_{N_{Interleaver}-1}$ | TCP-based (e.g. WWW, e-mail), chat, FTP, p2p file sharing |
| 9 | any | any | |

Here, interleaver candidates when a static or quasi-static allocation policy is adopted preferably have low correlation to each other. This is because in a static or quasi-static allocation policy, once an interleaver is allocated, the interleaver is not changed for a time longer than that in a dynamic allocation policy, and thus the state of interference is kept for the long time.

There are various conceivable allocation timings in a quasi-static allocation policy. For example, when a quasi-static allocation policy is adopted, the allocation control unit 144 can allocate an interleaver based on time elapsed from the previous interleaver allocation. Specifically, the allocation control unit 144 may determine whether to execute interleaver allocation in accordance with criterion formulas in Table 4 below.

TABLE 4

| Criterion formula | Interleaver allocation |
|---|---|
| $T_{elapse} < T_{th, elapse}$ | not performed |
| $T_{elapse} \geq T_{th, elapse}$ | performed |

Here, $T_{elapse}$ is communication elapsed time (ms) from the previous allocation. $T_{th,elapse}$ is a threshold value (ms) related to the communication elapsed time from the previous allocation. The threshold value $T_{th,elapse}$ related to the communication elapsed time can be regarded as an interleaver allocation cycle. For example, the interval control unit 142 can set the interleaver allocation cycle to the cycle of channel feedback from the terminal apparatus 200 or an integer multiple of the cycle. Alternatively, the interval control unit 142 can set the interleaver allocation cycle to the cycle of transmission of a reference signal for acquisition of channel information by the terminal apparatus 200 or an integer multiple of the cycle of transmission.

(5) Fifth Scenario

This scenario is a scenario in which an interleaver allocation rule corresponding to a QCI is adopted in addition to the third scenario. Specifically, the allocation control unit 144 may allocate an interleaver in accordance with an allocation rule corresponding to a QCI. For example, the allocation control unit 144 can allocate an interleave pattern of an interleaver type corresponding to a QCI, as an allocation rule corresponding to the QCI. For example, the allocation control unit 144 allocates any interleave pattern $\pi_{k,i}$ from a candidate set $\Pi_k$ of interleave patterns that can be allocated, which is expressed by Formula 2 below.

[Math.2]

$$\Pi_k = \{\pi_{k,0}, \pi_{k,1}, \ldots, \pi_{k,N_{Interleaver}-1}\}, 0 \leq k \leq N_{Pattern}-1 \quad \text{(Formula 2)}$$

Here, $N_{Pattern}$ is the total number of the candidate set $\Pi_k$, and k, which is the total number of allocation rules, indicates, for example, the total number of interleaver types. For example, the allocation control unit 144 may allocate an interleaver from among interleaver type candidates in an allocation rule corresponding to a QCI, in accordance with Table 5 below.

TABLE 5

| QCI | Interleaver allocation policy | Interleaver candidates | Example service |
|---|---|---|---|
| 1 | (quasi-)static | $\Pi_{k'}$ | Conversational voice |
| 2 | (quasi-)static | $\Pi_{k'}$ | Conversational video (live streaming) |
| 3 | dynamic | $\Pi_k$ (k ≠ k') | Non-conversational video (buffered streaming) |
| 4 | (quasi-)static | $\Pi_{k'}$ | Real time gaming |
| 5 | dynamic | $\Pi_k$ (k ≠ k') | IMS signaling |
| 6 | (quasi-)static | $\Pi_{k'}$ | Voice, video (live streaming), interactive gaming |
| 7 | dynamic | $\Pi_k$ (k ≠ k') | Video (buffered streaming) |
| 8 | dynamic | $\Pi_k$ (k ≠ k') | TCP-based (e.g. WWW, e-mail), chat, FTP, p2p file sharing |
| 9 | any | any | |

(6) Sixth Scenario

For example, the interval control unit 142 may change an interleaver allocation interval based on information indicating a statistic related to a packet transmitted or received by the terminal apparatus 200. For example, the interval control unit 142 can decide an interleaver allocation policy in accordance with criterion formulas A in Table 6 below, and the allocation control unit 144 can allocate an interleaver in accordance with criterion formulas B in Table 6 below.

TABLE 6

| Criterion formula A | Criterion formula B | Interleaver allocation policy | Interleaver allocation |
|---|---|---|---|
| $N_{ave,\,packet} < N_{th,\,packet}$ | $T_{elapse} < T_{th,\,elapse}$ | (quasi-)static | not performed |
| | $T_{elapse} \geq T_{th,\,elapse}$ | | performed |
| $N_{ave,\,packet} \geq N_{th,\,packet}$ | none | dynamic | performed |
| | none | | performed |

Here, $N_{ave,packet}$ is the average size (bit) of transmission or reception packets. $N_{th,packet}$ is a threshold value (bit) related to the average size of transmission or reception packets. The term "none" in the table means that determination using a criterion formula is skipped. Note that Table 6 is an example of association between information indicating a statistic related to a packet transmitted or received by the terminal apparatus 200 and interleaver allocation policies, and the interval control unit 142 may decide an allocation policy in accordance with different association.

(7) Seventh Scenario

For example, the interval control unit 142 may change an interleaver allocation interval based on information indicating a state of packet traffic of the terminal apparatus 200. For example, the interval control unit 142 may adopt a static or quasi-static allocation policy when the terminal apparatus 200 is in an idle state and only keeps connection with a serving cell, and adopt a dynamic allocation policy in other cases.

4. OPERATION PROCESSING

Next, an example of operation processing in the communication system 1 according to the present embodiment is described with reference to FIGS. 10 and 11. Here, the base station 100 has a function as the communication control apparatus 100.

FIG. 10 is a sequence diagram illustrating an example of the flow of notification processing of allocation information executed in the communication system 1 according to the present embodiment. As illustrated in FIG. 10, the base station 100 and the terminal apparatus 200 are related to this sequence.

As illustrated in FIG. 10, first, the base station 100 performs allocation processing in step S102. For example, the interval control unit 142 may switch an interleaver allocation policy or change an interleaver allocation interval. In addition, the allocation control unit 144 may allocate an interleaver to the terminal apparatus 200. Only either one of these may be performed.

Then, in step S104, the base station 100 transmits allocation information indicating an allocation result in step S102 to the terminal apparatus 200. For example, the radio communication unit 110 transmits the allocation information to the terminal apparatus 200 on a control channel.

Next, in step S106, the base station 100 and the terminal apparatus 200 perform communication in accordance with the transmitted or received allocation information.

In step S108, the terminal apparatus 200 transmits a change request to the base station 100. The change request is a message requesting a change of at least one of an allocation policy, an allocation interval, and the allocated interleaver. The terminal apparatus 200 can transmit the change request when, for example, interference from surroundings exceeds a threshold value.

Then, in step S110, the base station 100 performs change processing corresponding to the change request. For example, the interval control unit 142 may switch the interleaver allocation policy or, in the case of a quasi-static allocation policy, may change the allocation interval while keeping the policy. In addition, the allocation control unit 144 may change the interleaver allocated to the terminal apparatus 200. Needless to say, the base station 100 may reject the change request and not perform change processing.

Next, in step S112, the base station 100 transmits a change response indicating a response to the change request to the terminal apparatus 200. In the case where change processing has been performed in the base station 100, the change response includes allocation information indicating a change result in step S110. In the case where the change request has been rejected in the base station 100, the change response includes information indicating the rejection of the change request.

An example of notification processing of allocation information has been described. Next, setting processing of an interleaver allocation interval is described with reference to FIG. 11.

FIG. 11 is a flowchart illustrating an example of the flow of setting processing of an interleaver allocation interval executed in the communication control apparatus 100 according to the present embodiment.

As illustrated in FIG. 11, first, the control unit 140 acquires communication environment information in step S202. For example, the interval control unit 142 acquires communication environment information from the base station 100, the terminal apparatus 200, or another control apparatus or the like via the radio communication unit 110 or the network communication unit 120.

Then, in step S204, the control unit 140 determines whether or not the target terminal apparatus 200 is compatible with a static or quasi-static interleaver allocation policy. For example, the control unit 140 can perform this determination by referring to capability information of the terminal apparatus 200.

When the target terminal apparatus 200 is determined to be compatible (S204/YES), the control unit 140 determines whether or not the adoption of a static or quasi-static allocation policy is necessary in step S206. For example, the control unit 140 determines whether or not the adoption of a static or quasi-static allocation policy is necessary by using a determination criterion related to the scenario described above with an example.

When the adoption of a static or quasi-static allocation policy is determined to be necessary (S206/YES), the control unit 140 adopts a static or quasi-static allocation policy in step S208. In step S210, the control unit 140 sets an allocation interval. For example, when a static allocation policy is adopted, the control unit 140 sets the allocation interval infinite. When a quasi-static allocation policy is adopted, the control unit 140 sets the allocation interval to a time longer than the minimum TTI.

When the target terminal apparatus 200 is determined not to be compatible with a static or quasi-static interleaver allocation policy (S204/NO) or the adoption of a static or quasi-static allocation policy is determined not to be necessary (S206/NO), the processing proceeds to step S212. In step S212, the control unit 140 adopts a dynamic allocation policy. In step S214, the control unit 140 sets an allocation interval. For example, the control unit 140 sets the allocation interval to a time equal to the minimum TTI.

An example of setting processing of an interleaver allocation interval has been described. Note that the order of the above steps S204 and S206 may be reversed.

5. MODIFICATION EXAMPLES

The above-described technology related to interleaver allocation can be combined with other multiple access technologies.

(Case of OFDMA)

Hereinafter, a case of combining the above-described technology related to interleaver allocation with OFDMA will be described as an example. Although description is given assuming that the minimum unit of resources allocated to the terminal apparatuses 200 in OFDMA is a resource block (RB) including a plurality of subcarriers, the minimum unit may be any other unit, such as a subcarrier unit.

FIG. 12 is an explanatory diagram for describing resource allocation in OFDMA. In the example illustrated in FIG. 12, RB0 and RB1 are allocated to the terminal apparatus 200A, and RB2 and RB3 are allocated to the terminal apparatus 200B. In this way, different RBs are allocated to different terminal apparatuses 200 in OFDMA.

FIGS. 13 and 14 are explanatory diagrams for describing resource allocation when OFDMA and IDMA are combined. In the example illustrated in FIG. 13, an interleaver A is allocated to the terminal apparatus 200A, and an interleaver B is allocated to the terminal apparatus 200B. In addition, RB0, RB1, RB2, and RB3 are allocated to the terminal apparatuses 200A and 200B. In the example illustrated in FIG. 14, an interleaver A is allocated to the terminal apparatus 200A, and an interleaver B is allocated to the terminal apparatus 200B. In addition, RB1, RB2, and RB3 are allocated to the terminal apparatus 200A, and RB0, RB1, and RB2 are allocated to the terminal apparatus 200B. In this way, the plurality of terminal apparatuses 200 have different interleavers allocated, thereby sharing RBs.

The control unit 140 may switch an interleaver allocation policy, dynamically change an interleaver allocation interval, or allocate an interleaver as described above also in the case where OFDMA and IDMA are combined. At that time, the interval control unit 142 preferably sets an interleaver allocation interval to a time corresponding to a resource allocation interval for another access scheme. For example, in OFDMA, the interval control unit 142 sets an interleaver allocation interval to the same interval as an RB allocation interval or an integer multiple thereof. In this case, the base station 100 can perform signaling related to interleaver allocation and RB allocation at the same timing, and overhead is reduced. In addition, the base station 100 may perform signaling when one of a change of the allocated interleaver and a change of an RB is performed. Overhead is reduced also in this case. The scheduling of RBs by the base station 100 is performed by using a measurement result in the terminal apparatus 200, such as CSI measurement feedback. Accordingly, the interval control unit 142 may set an interleaver allocation interval to the same interval as the interval of CSI measurement feedback or an integer multiple thereof. Furthermore, the interval control unit 142 may set the intervals of interleaver allocation to the plurality of terminal apparatuses 200 to the same interval. In this case, correlation between channels or correlation between allocated interleavers of the terminal apparatuses 200 is prevented from fluctuating dynamically.

(Cases Excluding OFDMA)

The above-described technology related to interleaver allocation can be combined with a multiple access technology other than OFDMA. As in the case of OFDMA, the interval control unit 142 may set an interleaver allocation interval to a time corresponding to a resource allocation interval for another access scheme. Table 7 below shows multiple access technologies that can be combined with the above-described technology related to interleaver allocation and examples of allocated resources.

TABLE 7

| Multiple access technology | Resource type |
| --- | --- |
| CDMA | spread code |
| TDMA | time (time slot) |
| Non-Orthogonal Multiple Access by Superposition Coding & Successive Interference Canceller | electric power |
| SCMA (Sparse Code Multiple Access) | Mother Constellation, Codebook, and the like |
| SDMA | beam, weight matrix, steering vector, and the like |

Needless to say, the multiple access technologies and resources listed in the above table are examples, and the above-described technology related to interleaver allocation can be combined with any other multiple access technology.

6. APPLICATION EXAMPLES

The technology of an embodiment of the present disclosure is applicable to various products. For example, the communication control apparatus 100 may be realized as any type of server such as a tower server, a rack server, and a blade server. At least a part of elements of the communication control apparatus 100 may be realized in a control module (such as an integrated circuit module including a single die, and a card or a blade that is inserted into a slot of a blade server) mounted on a server.

For example, the communication control apparatus 100 may be realized as any type of evolved Node B (eNB) such as a macro eNB, and a small eNB. A small eNB may be an eNB that covers a cell smaller than a macro cell, such as a pico eNB, micro eNB, or home (femto) eNB. Instead, the communication control apparatus 100 may be realized as any other types of base stations such as a NodeB and a base transceiver station (BTS). The communication control apparatus 100 may include a main body (that is also referred to as a base station apparatus) configured to control radio communication, and one or more remote radio heads (RRH) disposed in a different place from the main body. Additionally, various types of terminals to be discussed later may also operate as the communication control apparatus 100 by temporarily or semi-permanently executing a base station function. Furthermore, at least a part of elements of the communication control apparatus 100 may be realized in the base station apparatus or a module for the base station apparatus.

For example, the terminal apparatus 200 may be realized as a mobile terminal such as a smartphone, a tablet personal computer (PC), a notebook PC, a portable game terminal, a portable/dongle type mobile router, and a digital camera, or an in-vehicle terminal such as a car navigation apparatus. The terminal apparatus 200 may also be realized as a terminal (that is also referred to as a machine type communication (MTC) terminal) that performs machine-to-machine (M2M) communication. Furthermore, at least a part of elements of the terminal apparatus 200 may be realized in a module (such as an integrated circuit module including a single die) mounted on each of the terminals.

6-1. Application Example Regarding Control Entity

FIG. 15 is a block diagram illustrating an example of a schematic configuration of a server 700 to which the technology of an embodiment of the present disclosure may be applied. The server 700 includes a processor 701, a memory 702, a storage 703, a network interface 704, and a bus 706.

The processor 701 may be, for example, a central processing unit (CPU) or a digital signal processor (DSP), and controls functions of the server 700. The memory 702 includes random access memory (RAM) and read only memory (ROM), and stores a program that is executed by the processor 701 and data. The storage 703 may include a storage medium such as a semiconductor memory and a hard disk.

The network interface 704 is a wired communication interface for connecting the server 700 to a wired communication network 705. The wired communication network 705 may be a core network such as an Evolved Packet Core (EPC), or a packet data network (PDN) such as the Internet.

The bus 706 connects the processor 701, the memory 702, the storage 703, and the network interface 704 to each other. The bus 706 may include two or more buses (such as a high speed bus and a low speed bus) each of which has different speed.

In the server 700 illustrated in FIG. 15, the interval control unit 142, the allocation control unit 144, and the communication control unit 146 described by using FIG. 6 may be implemented by the processor 701. As an example, a program for causing a processor to function as the interval control unit 142, the allocation control unit 144, and the communication control unit 146 (in other words, a program for causing a processor to execute the operations of the interval control unit 142, the allocation control unit 144, and the communication control unit 146) may be installed in the server 700 and the processor 701 may execute the program. As another example, a module including the processor 701 and the memory 702 may be mounted on the server 700 and the interval control unit 142, the allocation control unit 144, and the communication control unit 146 may be implemented by the module. In this case, the above module may store a program for causing a processor to function as the interval control unit 142, the allocation control unit 144, and the communication control unit 146 in the memory 702 and execute the program by the processor 701. As described above, the server 700 or the above module may be provided as an apparatus including the interval control unit 142, the allocation control unit 144, and the communication control unit 146, or the above program for causing a processor to function as the interval control unit 142, the allocation control unit 144, and the communication control unit 146 may be provided. Alternatively, a readable recording medium having the above program recorded thereon may be provided.

6.2. Application Examples Regarding Base Station

First Application Example

FIG. 16 is a block diagram illustrating a first example of a schematic configuration of an eNB to which the technology of an embodiment of the present disclosure may be applied. An eNB 800 includes one or more antennas 810 and a base station apparatus 820. Each antenna 810 and the base station apparatus 820 may be connected to each other via an RF cable.

Each of the antennas 810 includes a single or multiple antenna elements (such as multiple antenna elements included in an MIMO antenna), and is used for the base station apparatus 820 to transmit and receive radio signals. The eNB 800 may include the multiple antennas 810, as illustrated in FIG. 16. For example, the multiple antennas 810 may be compatible with multiple frequency bands used by the eNB 800. Although FIG. 16 illustrates the example in which the eNB 800 includes the multiple antennas 810, the eNB 800 may also include a single antenna 810.

The base station apparatus 820 includes a controller 821, a memory 822, a network interface 823, and a radio communication interface 825.

The controller 821 may be, for example, a CPU or a DSP, and operates various functions of a higher layer of the base station apparatus 820. For example, the controller 821 generates a data packet from data in signals processed by the radio communication interface 825, and transfers the generated packet via the network interface 823. The controller 821 may bundle data from multiple base band processors to generate the bundled packet, and transfer the generated bundled packet. The controller 821 may have logical functions of performing control such as radio resource control, radio bearer control, mobility management, admission control, and scheduling. The control may be performed in corporation with an eNB or a core network node in the vicinity. The memory 822 includes RAM and ROM, and stores a program that is executed by the controller 821, and various types of control data (such as a terminal list, transmission power data, and scheduling data).

The network interface 823 is a communication interface for connecting the base station apparatus 820 to a core network 824. The controller 821 may communicate with a core network node or another eNB via the network interface 823. In that case, the eNB 800, and the core network node or the other eNB may be connected to each other through a logical interface (such as an S1 interface and an X2 interface). The network interface 823 may also be a wired communication interface or a radio communication interface for radio backhaul. If the network interface 823 is a radio communication interface, the network interface 823 may use a higher frequency band for radio communication than a frequency band used by the radio communication interface 825.

The radio communication interface 825 supports any cellular communication scheme such as Long Term Evolution (LTE) and LTE-Advanced, and provides radio connection to a terminal positioned in a cell of the eNB 800 via the antenna 810. The radio communication interface 825 may typically include, for example, a baseband (BB) processor 826 and an RF circuit 827. The BB processor 826 may perform, for example, encoding/decoding, modulating/demodulating, and multiplexing/demultiplexing, and performs various types of signal processing of layers (such as L1, medium access control (MAC), radio link control (RLC), and a packet data convergence protocol (PDCP)). The BB processor 826 may have a part or all of the above-described logical functions instead of the controller 821. The BB processor 826 may be a memory that stores a communication control program, or a module that includes a processor and a related circuit configured to execute the program. Updating the program may allow the functions of the BB processor 826 to be changed. The module may be a card or a blade that is inserted into a slot of the base station apparatus 820. Alternatively, the module may also be a chip that is mounted on the card or the blade. Meanwhile, the RF circuit 827 may include, for example, a mixer, a filter, and an amplifier, and transmits and receives radio signals via the antenna 810.

The radio communication interface 825 may include the multiple BB processors 826, as illustrated in FIG. 16. For example, the multiple BB processors 826 may be compatible with multiple frequency bands used by the eNB 800. The radio communication interface 825 may include the multiple RF circuits 827, as illustrated in FIG. 16. For example, the multiple RF circuits 827 may be compatible with multiple antenna elements. Although FIG. 16 illustrates the example in which the radio communication interface 825 includes the multiple BB processors 826 and the multiple RF circuits 827, the radio communication interface 825 may also include a single BB processor 826 or a single RF circuit 827.

In the eNB 800 illustrated in FIG. 16, the interval control unit 142, the allocation control unit 144, and the communication control unit 146 described by using FIG. 6 may be implemented by the radio communication interface 825. Alternatively, at least a part of the elements may be implemented by the controller 821. As an example, a module including a part (e.g., the BB processor 826) or the whole of the radio communication interface 825 and/or the controller 821 may be mounted on the eNB 800 and the interval control unit 142, the allocation control unit 144, and the communication control unit 146 may be implemented by the module. In this case, the above module may store a program for causing a processor to function as the interval control unit 142, the allocation control unit 144, and the communication control unit 146 (in other words, a program for causing a processor to execute the operations of the interval control unit 142, the allocation control unit 144, and the communication control unit 146) and execute the program. As another example, a program for causing a processor to function as the interval control unit 142, the allocation control unit 144, and the communication control unit 146 may be installed in the eNB 800 and the radio communication interface 825 (e.g., the BB processor 826) and/or the controller 821 may execute the program. As described above, the eNB 800, the base station apparatus 820, or the above module may be provided as an apparatus including the interval control unit 142, the allocation control unit 144, and the communication control unit 146, or the program for causing a processor to function as the interval control unit 142, the allocation control unit 144, and the communication control unit 146 may be provided. Alternatively, a readable recording medium having the above program recorded thereon may be provided.

Furthermore, in the eNB 800 illustrated in FIG. 16, the radio communication unit 110 described by using FIG. 6 may be implemented by the radio communication interface 825 (e.g., the RF circuit 827). The network communication unit 120 may be implemented by the controller 821 and/or the network interface 823.

Second Application Example

FIG. 17 is a block diagram illustrating a second example of a schematic configuration of an eNB to which the technology of an embodiment of the present disclosure may be applied. An eNB 830 includes one or more antennas 840, a base station apparatus 850, and an RRH 860. Each antenna 840 and the RRH 860 may be connected to each other via an RF cable. The base station apparatus 850 and the RRH 860 may be connected to each other via a high speed line such as an optical fiber cable.

Each of the antennas 840 includes a single or multiple antenna elements (such as multiple antenna elements included in an MIMO antenna), and is used for the RRH 860 to transmit and receive radio signals. The eNB 830 may include the multiple antennas 840, as illustrated in FIG. 17. For example, the multiple antennas 840 may be compatible with multiple frequency bands used by the eNB 830.

Although FIG. 17 illustrates the example in which the eNB 830 includes the multiple antennas 840, the eNB 830 may also include a single antenna 840.

The base station apparatus 850 includes a controller 851, a memory 852, a network interface 853, a radio communication interface 855, and a connection interface 857. The controller 851, the memory 852, and the network interface 853 are the same as the controller 821, the memory 822, and the network interface 823 described with reference to FIG. 16.

The radio communication interface 855 supports any cellular communication scheme such as LTE and LTE-Advanced, and provides radio communication to a terminal positioned in a sector corresponding to the RRH 860 via the RRH 860 and the antenna 840. The radio communication interface 855 may typically include, for example, a BB processor 856. The BB processor 856 is the same as the BB processor 826 described with reference to FIG. 16, except the BB processor 856 is connected to the RF circuit 864 of the RRH 860 via the connection interface 857. The radio communication interface 855 may include the multiple BB processors 856, as illustrated in FIG. 17. For example, the multiple BB processors 856 may be compatible with multiple frequency bands used by the eNB 830. Although FIG. 17 illustrates the example in which the radio communication interface 855 includes the multiple BB processors 856, the radio communication interface 855 may also include a single BB processor 856.

The connection interface 857 is an interface for connecting the base station apparatus 850 (radio communication interface 855) to the RRH 860. The connection interface 857 may also be a communication module for communication in the above-described high speed line that connects the base station apparatus 850 (radio communication interface 855) to the RRH 860.

The RRH 860 includes a connection interface 861 and a radio communication interface 863.

The connection interface 861 is an interface for connecting the RRH 860 (radio communication interface 863) to the base station apparatus 850. The connection interface 861 may also be a communication module for communication in the above-described high speed line.

The radio communication interface 863 transmits and receives radio signals via the antenna 840. The radio communication interface 863 may typically include, for example, the RF circuit 864. The RF circuit 864 may include, for example, a mixer, a filter, and an amplifier, and transmits and receives radio signals via the antenna 840. The radio communication interface 863 may include multiple RF circuits 864, as illustrated in FIG. 17. For example, the multiple RF circuits 864 may support multiple antenna elements. Although FIG. 17 illustrates the example in which the radio communication interface 863 includes the multiple RF circuits 864, the radio communication interface 863 may also include a single RF circuit 864.

In the eNB 830 illustrated in FIG. 17, the interval control unit 142, the allocation control unit 144, and the communication control unit 146 described by using FIG. 6 may be implemented by the radio communication interface 855 and/or the radio communication interface 863. Alternatively, at least a part of the elements may be implemented by the controller 851. As an example, a module including a part (e.g., the BB processor 856) or the whole of the radio communication interface 855 and/or the controller 851 may be mounted on the eNB 830 and the interval control unit 142, the allocation control unit 144, and the communication control unit 146 may be implemented by the module. In this case, the above module may store a program for causing a processor to function as the interval control unit 142, the allocation control unit 144, and the communication control unit 146 (in other words, a program for causing a processor to execute the operations of the interval control unit 142, the allocation control unit 144, and the communication control unit 146) and execute the program. As another example, a program for causing a processor to function as the interval control unit 142, the allocation control unit 144, and the communication control unit 146 may be installed in the eNB 830 and the radio communication interface 855 (e.g., the BB processor 856) and/or the controller 851 may execute the program. As described above, the eNB 830, the base station apparatus 850, or the above module may be provided as an apparatus including the interval control unit 142, the allocation control unit 144, and the communication control unit 146, or the program for causing a processor to function as the interval control unit 142, the allocation control unit 144, and the communication control unit 146 may be provided. Alternatively, a readable recording medium having the above program recorded thereon may be provided.

Furthermore, in the eNB 830 illustrated in FIG. 17, the radio communication unit 110 described by using FIG. 6, for example, may be implemented by the radio communication interface 863 (e.g., the RF circuit 864). The network communication unit 120 may be implemented by the controller 851 and/or the network interface 853.

6.3. Application Examples Regarding Terminal Apparatus

First Application Example

FIG. 18 is a block diagram illustrating an example of a schematic configuration of a smartphone 900 to which the technology of an embodiment of the present disclosure may be applied. The smartphone 900 includes a processor 901, a memory 902, a storage 903, an external connection interface 904, a camera 906, a sensor 907, a microphone 908, an input device 909, a display device 910, a speaker 911, a radio communication interface 912, one or more antenna switches 915, one or more antennas 916, a bus 917, a battery 918, and an auxiliary controller 919.

The processor 901 may be, for example, a CPU or a system on a chip (SoC), and controls functions of an application layer and another layer of the smartphone 900. The memory 902 includes RAM and ROM, and stores a program that is executed by the processor 901, and data. The storage 903 may include a storage medium such as a semiconductor memory and a hard disk. The external connection interface 904 is an interface for connecting an external device such as a memory card and a universal serial bus (USB) device to the smartphone 900.

The camera 906 includes an image sensor such as a charge coupled device (CCD) and a complementary metal oxide semiconductor (CMOS), and generates a captured image. The sensor 907 may include a group of sensors such as a measurement sensor, a gyro sensor, a geomagnetic sensor, and an acceleration sensor. The microphone 908 converts sounds that are input to the smartphone 900 to audio signals. The input device 909 includes, for example, a touch sensor configured to detect touch onto a screen of the display device 910, a keypad, a keyboard, a button, or a switch, and receives an operation or an information input from a user. The display device 910 includes a screen such as a liquid crystal display (LCD) and an organic light-emitting diode (OLED) display, and displays an output image of the smartphone 900. The speaker 911 converts audio signals that are output from the smartphone 900 to sounds.

The radio communication interface 912 supports any cellular communication scheme such as LTE and LTE-Advanced, and performs radio communication. The radio communication interface 912 may typically include, for example, a BB processor 913 and an RF circuit 914. The BB processor 913 may perform, for example, encoding/decoding, modulating/demodulating, and multiplexing/demultiplexing, and performs various types of signal processing for radio communication. Meanwhile, the RF circuit 914 may include, for example, a mixer, a filter, and an amplifier, and transmits and receives radio signals via the antenna 916. The radio communication interface 913 may also be a one chip module that has the BB processor 913 and the RF circuit 914 integrated thereon. The radio communication interface 912 may include the multiple BB processors 913 and the multiple RF circuits 914, as illustrated in FIG. 18. Although FIG. 18 illustrates the example in which the radio communication interface 913 includes the multiple BB processors 913 and the multiple RF circuits 914, the radio communication interface 912 may also include a single BB processor 913 or a single RF circuit 914.

Furthermore, in addition to a cellular communication scheme, the radio communication interface 912 may support another type of radio communication scheme such as a short-distance wireless communication scheme, a near field communication scheme, and a radio local area network (LAN) scheme. In that case, the radio communication interface 912 may include the BB processor 913 and the RF circuit 914 for each radio communication scheme.

Each of the antenna switches 915 switches connection destinations of the antennas 916 among multiple circuits (such as circuits for different radio communication schemes) included in the radio communication interface 912.

Each of the antennas 916 includes a single or multiple antenna elements (such as multiple antenna elements included in an MIMO antenna), and is used for the radio communication interface 912 to transmit and receive radio signals. The smartphone 900 may include the multiple antennas 916, as illustrated in FIG. 18. Although FIG. 18 illustrates the example in which the smartphone 900 includes the multiple antennas 916, the smartphone 900 may also include a single antenna 916.

Furthermore, the smartphone 900 may include the antenna 916 for each radio communication scheme. In that case, the antenna switches 915 may be omitted from the configuration of the smartphone 900.

The bus 917 connects the processor 901, the memory 902, the storage 903, the external connection interface 904, the camera 906, the sensor 907, the microphone 908, the input device 909, the display device 910, the speaker 911, the radio communication interface 912, and the auxiliary controller 919 to each other. The battery 918 supplies power to blocks of the smartphone 900 illustrated in FIG. 18 via feeder lines, which are partially shown as dashed lines in the figure. The auxiliary controller 919 operates a minimum necessary function of the smartphone 900, for example, in a sleep mode.

In the smartphone 900 illustrated in FIG. 18, the control unit 230 described by using FIG. 8 may be implemented by the radio communication interface 912. Alternatively, at least a part of the elements may be implemented by the processor 901 or the auxiliary controller 919. As an example, a module including a part (e.g., the BB processor 913) or the whole of the radio communication interface 912, the processor 901, and/or the auxiliary controller 919 may be mounted on the smartphone 900 and the control unit 230 may be implemented by the module. In this case, the above module may store a program for causing a processor to function as the control unit 230 (in other words, a program for causing a processor to execute the operations of the control unit 230) and execute the program. As another example, a program for causing a processor to function as the control unit 230 may be installed in the smartphone 900 and the radio communication interface 912 (e.g., the BB processor 913), the processor 901, and/or the auxiliary controller 919 may execute the program. As described above, the smartphone 900 or the above module may be provided as an apparatus including the control unit 230, or the program for causing a processor to function as the control unit 230 may be provided. Alternatively, a readable recording medium having the above program recorded thereon may be provided.

Furthermore, in the smartphone 900 illustrated in FIG. 18, the radio communication unit 210 described by using FIG. 8, for example, may be implemented by the radio communication interface 912 (e.g., the RF circuit 914).

Second Application Example

FIG. 19 is a block diagram illustrating an example of a schematic configuration of a car navigation apparatus 920 to which the technology of an embodiment of the present disclosure may be applied. The car navigation apparatus 920 includes a processor 921, a memory 922, a global positioning system (GPS) module 924, a sensor 925, a data interface 926, a content player 927, a storage medium interface 928, an input device 929, a display device 930, a speaker 931, a radio communication interface 933, one or more antenna switches 936, one or more antennas 937, and a battery 938.

The processor 921 may be, for example, a CPU or a SoC, and controls a navigation function and another function of the car navigation apparatus 920. The memory 922 includes RAM and ROM, and stores a program that is executed by the processor 921, and data.

The GPS module 924 uses GPS signals received from a GPS satellite to measure a position (such as latitude, longitude, and altitude) of the car navigation apparatus 920. The sensor 925 may include a group of sensors such as a gyro sensor, a geomagnetic sensor, and an air pressure sensor. The data interface 926 is connected to, for example, an in-vehicle network 941 via a terminal that is not shown, and acquires data generated by the vehicle, such as vehicle speed data.

The content player 927 reproduces content stored in a storage medium (such as a CD and a DVD) that is inserted into the storage medium interface 928. The input device 929 includes, for example, a touch sensor configured to detect touch onto a screen of the display device 930, a button, or a switch, and receives an operation or an information input from a user. The display device 930 includes a screen such as a LCD or an OLED display, and displays an image of the navigation function or content that is reproduced. The speaker 931 outputs sounds of the navigation function or the content that is reproduced.

The radio communication interface 933 supports any cellular communication scheme such as LET and LTE-Advanced, and performs radio communication. The radio communication interface 933 may typically include, for example, a BB processor 934 and an RF circuit 935. The BB processor 934 may perform, for example, encoding/decoding, modulating/demodulating, and multiplexing/demultiplexing, and performs various types of signal processing for radio communication. Meanwhile, the RF circuit 935 may include, for example, a mixer, a filter, and an amplifier, and transmits and receives radio signals via the antenna 937. The radio communication interface 933 may be a one chip module having the BB processor 934 and the RF circuit 935 integrated thereon. The radio communication interface 933 may include the multiple BB processors 934 and the multiple RF circuits 935, as illustrated in FIG. 19. Although FIG. 19 illustrates the example in which the radio communication interface 933 includes the multiple BB processors 934 and the multiple RF circuits 935, the radio communication interface 933 may also include a single BB processor 934 or a single RF circuit 935.

Furthermore, in addition to a cellular communication scheme, the radio communication interface 933 may support another type of radio communication scheme such as a short-distance wireless communication scheme, a near field communication scheme, and a radio LAN scheme. In that case, the radio communication interface 933 may include the BB processor 934 and the RF circuit 935 for each radio communication scheme.

Each of the antenna switches 936 switches connection destinations of the antennas 937 among multiple circuits (such as circuits for different radio communication schemes) included in the radio communication interface 933.

Each of the antennas 937 includes a single or multiple antenna elements (such as multiple antenna elements included in an MIMO antenna), and is used for the radio communication interface 933 to transmit and receive radio signals. The car navigation apparatus 920 may include the multiple antennas 937, as illustrated in FIG. 19. Although FIG. 19 illustrates the example in which the car navigation apparatus 920 includes the multiple antennas 937, the car navigation apparatus 920 may also include a single antenna 937.

Furthermore, the car navigation apparatus 920 may include the antenna 937 for each radio communication scheme. In that case, the antenna switches 936 may be omitted from the configuration of the car navigation apparatus 920.

The battery 938 supplies power to blocks of the car navigation apparatus 920 illustrated in FIG. 19 via feeder lines that are partially shown as dashed lines in the figure. The battery 938 accumulates power supplied from the vehicle.

In the car navigation apparatus 920 illustrated in FIG. 19, the control unit 230 described by using FIG. 8 may be implemented by the radio communication interface 933. Alternatively, at least a part of the elements may be implemented by the processor 921. As an example, a module including a part (e.g., the BB processor 934) or the whole of the radio communication interface 933 and/or the processor 921 may be mounted on the car navigation apparatus 920 and the control unit 230 may be implemented by the module. In this case, the above module may store a program for causing a processor to function as the control unit 230 (in other words, a program for causing a processor to execute the operations of the control unit 230) and execute the program. As another example, a program for causing a processor to function as the control unit 230 may be installed in the car navigation apparatus 920 and the radio communication interface 933 (e.g., the BB processor 934) and/or the processor 921 may execute the program. As described above, the car navigation apparatus 920 or the above module may be provided as an apparatus including the control unit 230, or the program for causing a processor to function as the control unit 230 may be provided. Alternatively, a readable recording medium having the above program recorded thereon may be provided.

Furthermore, in the car navigation apparatus 920 illustrated in FIG. 19, the radio communication unit 210 described by using FIG. 8, for example, may be implemented by the radio communication interface 933 (e.g., the RF circuit 935).

The technology of an embodiment of the present disclosure may also be realized as an in-vehicle system (or a vehicle) 940 including one or more blocks of the car navigation apparatus 920, the in-vehicle network 941, and a vehicle module 942. That is, the in-vehicle system (or a vehicle) 940 may be provided as an apparatus including the control unit 230. The vehicle module 942 generates vehicle data such as vehicle speed, engine speed, and trouble information, and outputs the generated data to the in-vehicle network 941.

7. CONCLUSION

An embodiment of the present disclosure has been described in detail with reference to FIGS. 1 to 19. As described above, the communication control apparatus 100 performs communication with a radio communication apparatus of a communication system in which IDMA is used, and dynamically changes the interval of allocation of an interleaver used for IDMA in the base station 100 or the terminal apparatus 200. Specifically, the communication control apparatus 100 changes an interleaver allocation interval to a time longer than the minimum TTI. Thus, interleaver allocation is performed on the base station 100 and the terminal apparatus 200 at a time interval longer than that of a dynamic allocation policy. This makes it possible to reduce overhead related to interleaver allocation in the communication system 1 in which IDMA is adopted.

Furthermore, the communication control apparatus 100 can dynamically change an interleaver allocation interval based on communication environment information such as a QCI, a statistic related to a packet transmitted and received by the terminal apparatus 200, or the category of an application. Thus, for example, the allocation interval can be changed in accordance with the situation of interference of the terminal apparatus 200, which allows more flexible scheduling.

Furthermore, the communication control apparatus 100 can set an interleaver allocation interval to a time corresponding to a resource allocation interval for another multiple access scheme. Thus, the communication control apparatus 100 can collectively perform signaling related to interleaver allocation and resource allocation for another multiple access scheme. This can reduce overhead related to notification of an allocation result.

It should be understood by those skilled in the art that various modifications, combinations, sub-combinations and alterations may occur depending on design requirements and other factors insofar as they are within the scope of the appended claims or the equivalents thereof.

For example, in the above embodiment, the interval control unit 142, the allocation control unit 144, and the communication control unit 146 are described to be implemented as a logical entity and included in the control unit 140; however, an embodiment of the present technology is not limited to such an example. For example, all or part of the interval control unit 142, the allocation control unit 144, and the communication control unit 146 may be included in the physical layer controller 112. Alternatively, all or part of the interval control unit 142, the allocation control unit 144, and the communication control unit 146 may be implemented as an independent physical entity. For example, all or part of the interval control unit 142, the allocation control unit 144, and the communication control unit 146 may be included in a server or the like on the core network 400 and the rest of the elements may be included in the base station 100.

Note that it is not necessary for the processing described in this specification with reference to the flowchart to be executed in the order shown in the flowchart. Some processing steps may be performed in parallel. Further, some of additional steps can be adopted, or some processing steps can be omitted.

In addition, the effects described in the present specification are merely illustrative and demonstrative, and not limitative. In other words, the technology according to an embodiment of the present disclosure can exhibit other effects that are evident to those skilled in the art along with or instead of the effects based on the present specification.

Additionally, the present technology may also be configured as below.

(1)

A communication control apparatus including:

a communication unit configured to perform communication with a radio communication apparatus of a communication system in which interleave division multiple access (IDMA) is used; and an interval control unit configured to dynamically change an interval of allocation of an interleaver used for IDMA by the radio communication apparatus.

(2)

The communication control apparatus according to (1), wherein the interval control unit changes the interval based on information related to communication by the radio communication apparatus.

(3)

The communication control apparatus according to (2), wherein the interval control unit changes the interval based on a quality of service class identifier (QCI).

(4)

The communication control apparatus according to (2) or (3), wherein the interval control unit changes the interval based on information indicating a statistic related to a packet transmitted or received by the radio communication apparatus.

(5)

The communication control apparatus according to any one of (2) to (4), wherein the interval control unit changes the interval based on information indicating a category of an application used by the radio communication apparatus.

(6)

The communication control apparatus according to any one of (1) to (5), wherein the interval control unit sets the interval to a time corresponding to a resource allocation interval for another access scheme.

(7)

The communication control apparatus according to any one of (1) to (6), wherein the communication unit transmits information indicating the interval to the radio communication apparatus.

(8)
The communication control apparatus according to any one of (1) to (7), further including:
an allocation control unit configured to allocate the interleaver at the interval set by the interval control unit.

(9)
The communication control apparatus according to (8), wherein the allocation control unit allocates the interleaver based on information related to communication by the radio communication apparatus.

(10)
The communication control apparatus according to (9), wherein the allocation control unit allocates the interleaver based on a QCI.

(11)
The communication control apparatus according to (9) or (10),
wherein the allocation control unit allocates the interleaver in accordance with an allocation rule corresponding to information related to communication by the radio communication apparatus.

(12)
The communication control apparatus according to (11), wherein the allocation control unit allocates the interleaver in accordance with an allocation rule corresponding to a QCI.

(13)
The communication control apparatus according to any one of (1) to (12),
wherein the interval control unit changes the interval to a time longer than a minimum TTI.

(14)
The communication control apparatus according to any one of (1) to (13),
wherein the interval control unit changes the interval to a time equal to a minimum TTI.

(15)
A radio communication apparatus including:
a radio communication unit configured to perform radio communication using IDMA with another radio communication apparatus; and
a control unit configured to control the radio communication unit to cause the radio communication unit to perform interleave processing using an interleaver allocated at an interval that is dynamically changed.

(16)
The radio communication apparatus according to (15), wherein the control unit controls the radio communication unit to cause the radio communication unit to transmit, in accordance with a situation of communication by the radio communication unit, a message requesting a change of the interval or allocation of the interleaver.

(17)
A communication control method including:
performing communication with a radio communication apparatus of a communication system in which IDMA is used; and
dynamically changing, by a processor, an interval of allocation of an interleaver used for IDMA by the radio communication apparatus.

(18)
A radio communication method including:
performing radio communication using IDMA with another radio communication apparatus; and
performing control, by a processor, to cause interleave processing using an interleaver allocated at an interval that is dynamically changed to be performed.

(19)
A program causing a computer to function as:
a communication unit configured to perform communication with a radio communication apparatus of a communication system in which IDMA is used; and
an interval control unit configured to dynamically change an interval of allocation of an interleaver used for IDMA by the radio communication apparatus.

(20)
A program causing a computer to function as:
a radio communication unit configured to perform radio communication using IDMA with another radio communication apparatus; and
a control unit configured to control the radio communication unit to cause the radio communication unit to perform interleave processing using an interleaver allocated at an interval that is dynamically changed.

(21)
A communication control apparatus comprising:
circuitry configured to
communicate with a radio communication apparatus of a communication system that uses interleave division multiple access (IDMA), and
controllably change an interval of allocation of an interleaver used for IDMA by the radio communication apparatus.

(22)
The communication control apparatus according to (21), wherein the circuitry is configured to change the interval based on information related to communication by the radio communication apparatus.

(23)
The communication control apparatus according to (22), wherein the circuitry is configured to change the interval based on a quality of service class identifier (QCI).

(24)
The communication control apparatus according to (22), wherein the circuitry is configured to change the interval based on packet communication statistics information.

(25)
The communication control apparatus according to (22), wherein the circuitry is configured to change the interval based on information indicating a category of an application used by the radio communication apparatus.

(26)
The communication control apparatus according to (21), wherein the circuitry is configured to set the interval to a time corresponding to a resource allocation interval of another access scheme.

(27)
The communication control apparatus according to (21), wherein the circuitry is configured to transmit information indicating the interval to the radio communication apparatus.

(28)
The communication control apparatus according to (21), wherein the circuitry is further configured to allocate the interleaver at the interval previously set by the circuitry.

(29)
The communication control apparatus according to (28), wherein the circuitry is configured to allocate the interleaver based on information related to communications conducted by the radio communication apparatus.

(30)
The communication control apparatus according to (29), wherein the circuitry is configured to allocate the interleaver based on a QCI.

(31)
The communication control apparatus according to (29), wherein the circuitry is configured to allocate the interleaver in accordance with an allocation rule that corresponds to information related to communications conducted by the radio communication apparatus.
(32)
The communication control apparatus according to (21), wherein the circuitry is configured to allocate the interleaver in accordance with an allocation rule corresponding to a QCI.
(33)
The communication control apparatus according to (21), wherein the circuitry is configured to change the interval to a time longer than a minimum TTI.
(34)
The communication control apparatus according to (21), wherein the circuitry is configured to change the interval to a time equal to a minimum TTI.
(35)
The communication control apparatus according to (21), wherein the circuitry is configured to controllably change the interval of allocation based on a predetermined policy.
(36)
The communication control apparatus according to (35), wherein the predetermined policy dictates a selection between dynamic and quasi-static.
(37)
A radio communication apparatus comprising:
an interleaver; and
circuitry configured to
perform radio communication using IDMA with another radio communication apparatus, and
controllably change an interval allocated of the interleaver.
(38)
The radio communication apparatus according to (37), wherein the circuitry is configured to transmit a message requesting a change of the interval.
(39)
A communication control method comprising:
performing communication with a radio communication apparatus of a communication system in which IDMA is used; and
controllably changing, with circuitry, an interval of allocation of an interleaver used for IDMA by the radio communication apparatus.
(40)
The radio communication method of (39), wherein the controllably changing includes changing to one of a dynamic allocation and a quasi-static allocation.

REFERENCE SIGNS LIST 1 communication system
100 communication control apparatus, base station
110 radio communication unit
112 physical layer controller
114 interleave unit
120 network communication unit
130 storage unit
140 control unit
142 interval control unit
144 allocation control unit
146 communication control unit
200 terminal apparatus
210 radio communication unit
212 physical layer controller
214 interleave unit
220 storage unit
230 control unit
300 cell
400 core network

The invention claimed is:

1. A communication control apparatus, comprising:
a memory; and
circuitry configured to
communicate with a radio communication apparatus of a communication system that uses non-orthogonal multiple access,
periodically allocate a different interleaver used for non-orthogonal multiple access by the radio communication apparatus at an interval, and
controllably change a duration of the interval of periodically allocating the different interleaver used for non-orthogonal multiple access by the radio communication apparatus based on information received from the radio communication apparatus, the information indicating a state of the radio communication apparatus.

2. The communication control apparatus according to claim 1, wherein the circuitry is configured to change the interval based on second information related to communication by the radio communication apparatus.

3. The communication control apparatus according to claim 2, wherein the circuitry is configured to change the duration of the interval based on a quality of service class identifier (QCI).

4. The communication control apparatus according to claim 2, wherein the circuitry is configured to change the duration of the interval based on packet communication statistics information.

5. The communication control apparatus according to claim 2, wherein the circuitry is configured to change the duration of the interval based on third information indicating a category of an application used by the radio communication apparatus.

6. The communication control apparatus according to claim 1, wherein the circuitry is configured to set the duration of the interval to a time corresponding to a resource allocation interval of another access scheme.

7. The communication control apparatus according to claim 1, wherein the circuitry is configured to transmit interval information indicating the interval to the radio communication apparatus.

8. The communication control apparatus according to claim 1, wherein the circuitry is further configured to allocate the interleaver at a previous interval previously set by the circuitry.

9. The communication control apparatus according to claim 8, wherein the circuitry is configured to allocate the interleaver based on second information related to communications conducted by the radio communication apparatus.

10. The communication control apparatus according to claim 9, wherein the circuitry is configured to allocate the interleaver based on a quality of service class identifier (QCI).

11. The communication control apparatus according to claim 9, wherein the circuitry is configured to allocate the interleaver in accordance with an allocation rule that corresponds to the second information related to communications conducted by the radio communication apparatus.

12. The communication control apparatus according to claim 11, wherein the circuitry is configured to allocate the interleaver in accordance with an allocation rule corresponding to a QCI.

13. The communication control apparatus according to claim 1, wherein the circuitry is configured to change the duration of the interval to a time longer than a minimum transmission time interval (TTI).

14. The communication control apparatus according to claim 1, wherein the circuitry is configured to change the duration of the interval to a time equal to a minimum transmission time interval (TTI).

15. The communication control apparatus according to claim 1, wherein the circuitry is configured to controllably change the duration of the interval of allocation based on a predetermined policy.

16. The communication control apparatus according to claim 15, wherein the predetermined policy dictates a selection between dynamic and quasi-static.

17. A radio communication apparatus, comprising:
an interleaver; and
circuitry configured to
perform radio communication using non-orthogonal multiple access with another radio communication apparatus,
periodically allocate a different interleaver used for non-orthogonal multiple access with the another radio communication apparatus at an interval, and
controllably change a duration of the interval of periodically allocating the different interleaver based on information received from the another radio communication apparatus, the information indicating a state of the radio communication apparatus.

18. The radio communication apparatus according to claim 17, wherein the circuitry is configured to transmit a message requesting a change of the duration of the interval.

19. A radio communication control method, comprising:
performing communication with a radio communication apparatus of a communication system in which non-orthogonal multiple access is used;
periodically allocating a different interleaver used for non-orthogonal multiple access by the radio communication apparatus at an interval; and
controllably changing, with circuitry, a duration of the interval of periodically allocating the different interleaver used for non-orthogonal multiple access by the radio communication apparatus based on information received from the radio communication apparatus, the information indicating a state of the radio communication apparatus.

20. The radio communication method of claim 19, wherein the controllably changing includes changing to one of a dynamic allocation and a quasi-static allocation.

* * * * *